(12) United States Patent
Choi et al.

(10) Patent No.: US 10,497,421 B2
(45) Date of Patent: Dec. 3, 2019

(54) MEMORY DEVICE

(71) Applicant: SK hynix Inc., Gyeonggi-do (KR)

(72) Inventors: Hae-Rang Choi, Gyeonggi-do (KR);
Sung-Soo Chi, Gyeonggi-do (KR);
Hyung-Sik Won, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 162 days.

(21) Appl. No.: 15/677,085

(22) Filed: Aug. 15, 2017

(65) Prior Publication Data

US 2018/0108401 A1    Apr. 19, 2018

(30) Foreign Application Priority Data

Oct. 17, 2016  (KR) .......................... 10-2016-0134237

(51) Int. Cl.
*G11C 11/406*    (2006.01)
*G11C 11/4096*    (2006.01)

(52) U.S. Cl.
CPC .... *G11C 11/40615* (2013.01); *G11C 11/4096* (2013.01); *G11C 11/40603* (2013.01)

(58) Field of Classification Search
CPC ................................ G11C 8/10; G11C 11/406
USPC ............................................. 365/222, 230.06
See application file for complete search history.

(56) References Cited

U.S. PATENT DOCUMENTS

| | | | | |
|---|---|---|---|---|
| 6,160,778 A * | 12/2000 | Ito | ...................... | G11B 20/1833 369/275.3 |
| 6,603,694 B1 * | 8/2003 | Frankowsky | ......... | G11C 11/406 365/222 |
| 6,842,580 B1 * | 1/2005 | Ueda | .................. | G11B 20/1217 386/248 |
| 7,565,479 B2 * | 7/2009 | Best | ...................... | G11C 11/406 711/103 |
| 8,358,554 B2 * | 1/2013 | Kim | ...................... | G11C 11/406 365/149 |
| 9,025,405 B2 * | 5/2015 | Jeong | .................... | G11C 11/402 365/149 |
| 9,129,702 B2 * | 9/2015 | Kim | ...................... | G11C 11/406 |
| 9,978,430 B2 * | 5/2018 | Seo | .................. | G11C 11/40611 |
| 2001/0008498 A1 * | 7/2001 | Ooishi | ...................... | G11C 7/10 365/230.03 |
| 2005/0281089 A1 * | 12/2005 | Sukegawa | .............. | G11C 16/26 365/201 |

(Continued)

FOREIGN PATENT DOCUMENTS

KR    1020120131423    12/2012
KR    1020140016004    2/2014
KR    1020140112164    9/2014

*Primary Examiner* — Michael T Tran
(74) *Attorney, Agent, or Firm* — IP & T Group LLP

(57) ABSTRACT

A memory device includes a plurality of memory cells, a weak address storage block suitable for storing a weak address of a weak cell of which data retention time is shorter than a reference time, among the plurality of memory cells, a refresh counter suitable for generating a counting address, and an address selection block suitable for outputting a refresh address by selecting one of the counting address and the weak address, wherein, in selecting the counting address, the address selection block selects the weak address for a predetermined period, when a value of at least one preset bit of the counting address is changed.

18 Claims, 14 Drawing Sheets

(56) References Cited

U.S. PATENT DOCUMENTS

| | | | |
|---|---|---|---|
| 2006/0056256 A1* | 3/2006 | Takai | G11C 11/406 365/222 |
| 2007/0030746 A1* | 2/2007 | Best | G11C 11/406 365/222 |
| 2007/0033338 A1* | 2/2007 | Tsern | G11C 11/406 711/106 |
| 2007/0033339 A1* | 2/2007 | Best | G11C 11/406 711/106 |
| 2008/0168252 A1* | 7/2008 | Kunimune | G06F 12/0246 711/173 |
| 2009/0129156 A1* | 5/2009 | Komine | G11C 11/5628 365/185.03 |
| 2009/0147606 A1* | 6/2009 | Daniel | G11C 11/406 365/222 |
| 2010/0290292 A1* | 11/2010 | Tanizaki | G11C 16/10 365/185.22 |
| 2011/0161578 A1* | 6/2011 | Kim | G11C 11/406 711/106 |
| 2013/0016574 A1* | 1/2013 | Kim | G11C 11/40622 365/189.07 |
| 2013/0173970 A1* | 7/2013 | Kleveland | G11C 29/44 714/710 |
| 2014/0016421 A1* | 1/2014 | Kim | G11C 7/00 365/222 |
| 2014/0085999 A1* | 3/2014 | Kang | G11C 29/023 365/222 |
| 2014/0086001 A1* | 3/2014 | Fukano | G11C 8/10 365/230.03 |
| 2014/0104922 A1* | 4/2014 | Tiburzi | G11C 7/12 365/148 |
| 2014/0146624 A1* | 5/2014 | Son | G11C 29/4401 365/200 |
| 2016/0133314 A1* | 5/2016 | Hwang | G11C 11/40611 365/189.02 |
| 2016/0155515 A1* | 6/2016 | Son | G11C 29/4401 714/719 |
| 2017/0117060 A1* | 4/2017 | Sano | G11C 11/412 |
| 2017/0324399 A1* | 11/2017 | Kanzaki | G05F 1/56 |
| 2019/0196973 A1* | 6/2019 | Horner | G06N 10/00 |

\* cited by examiner

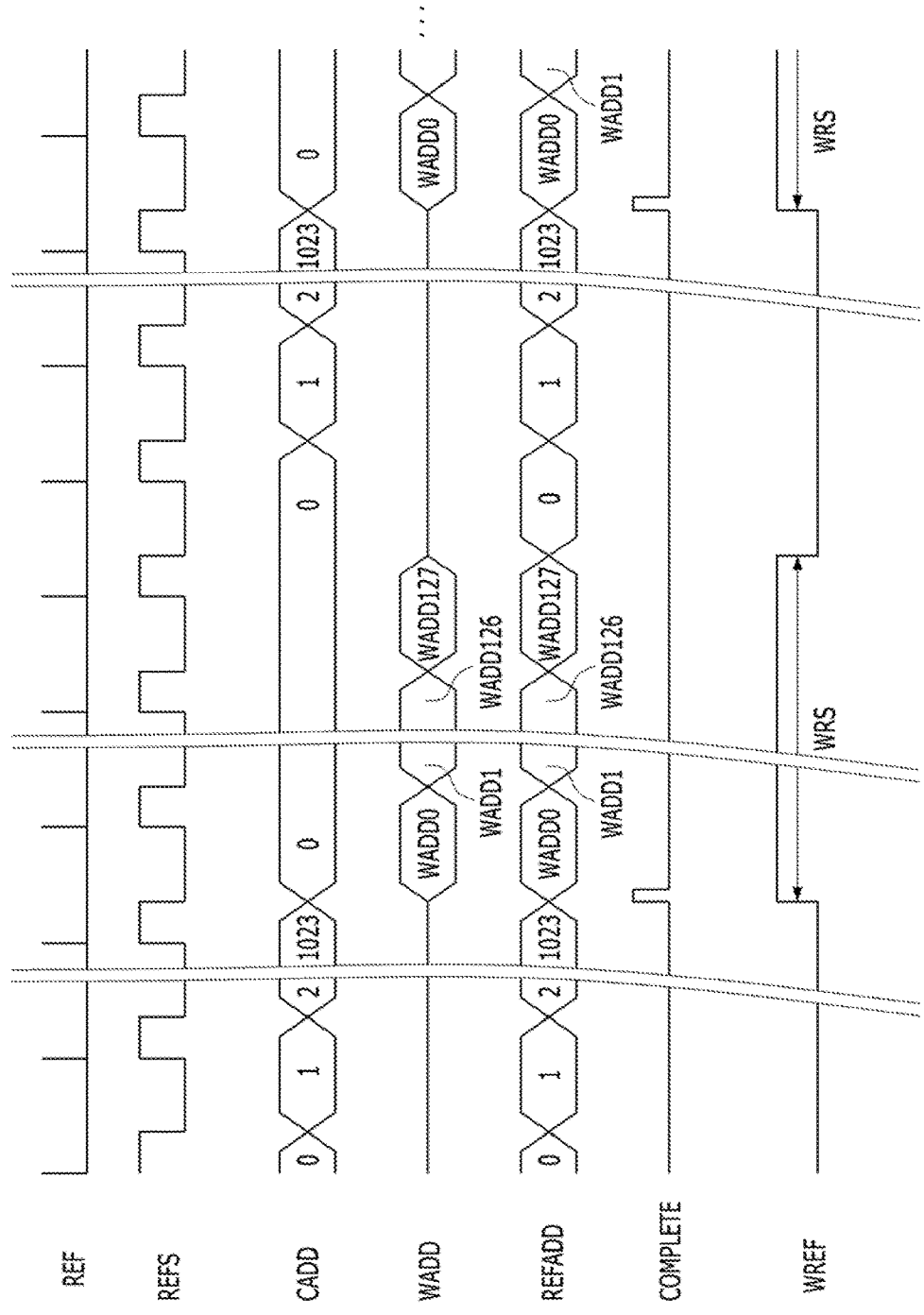

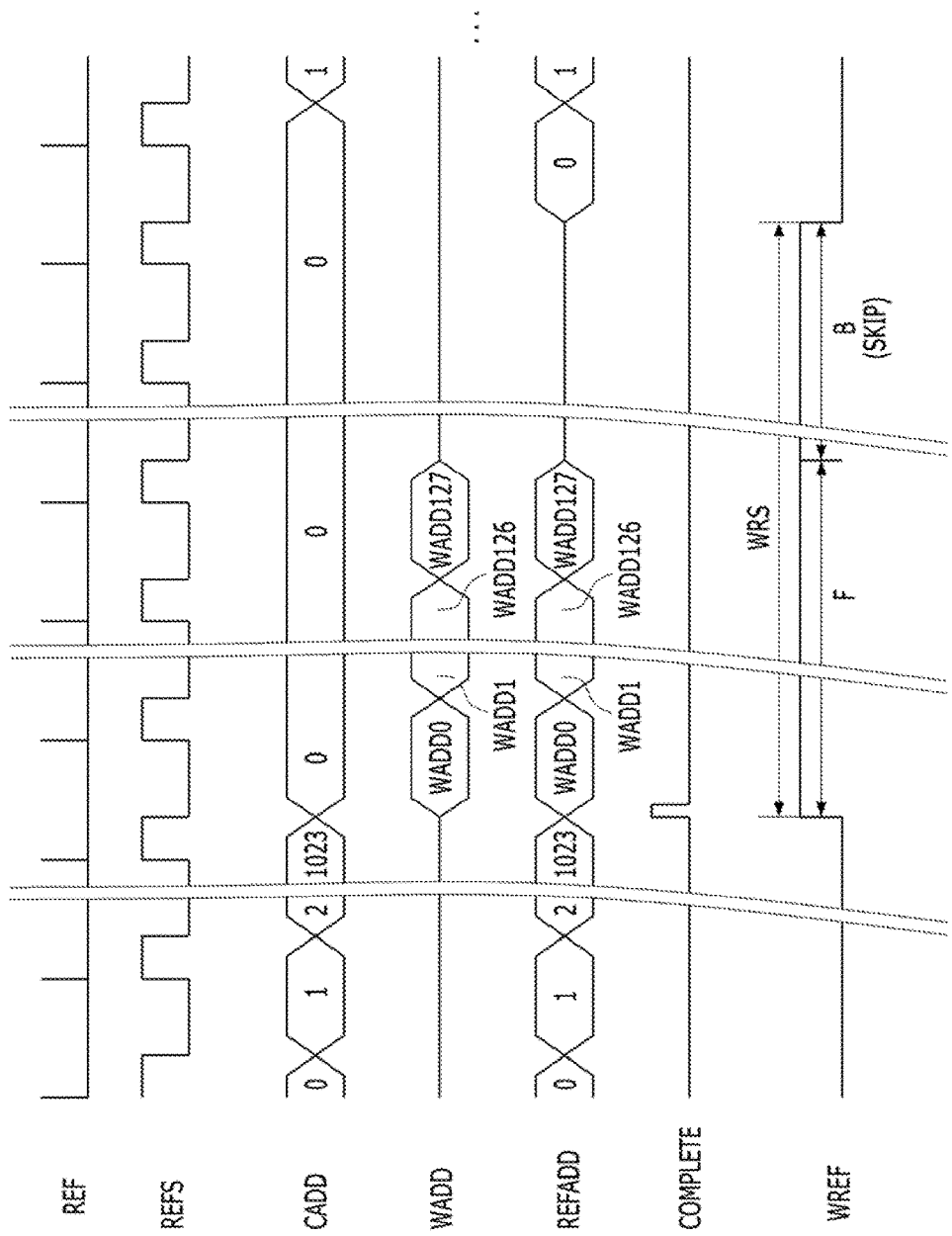

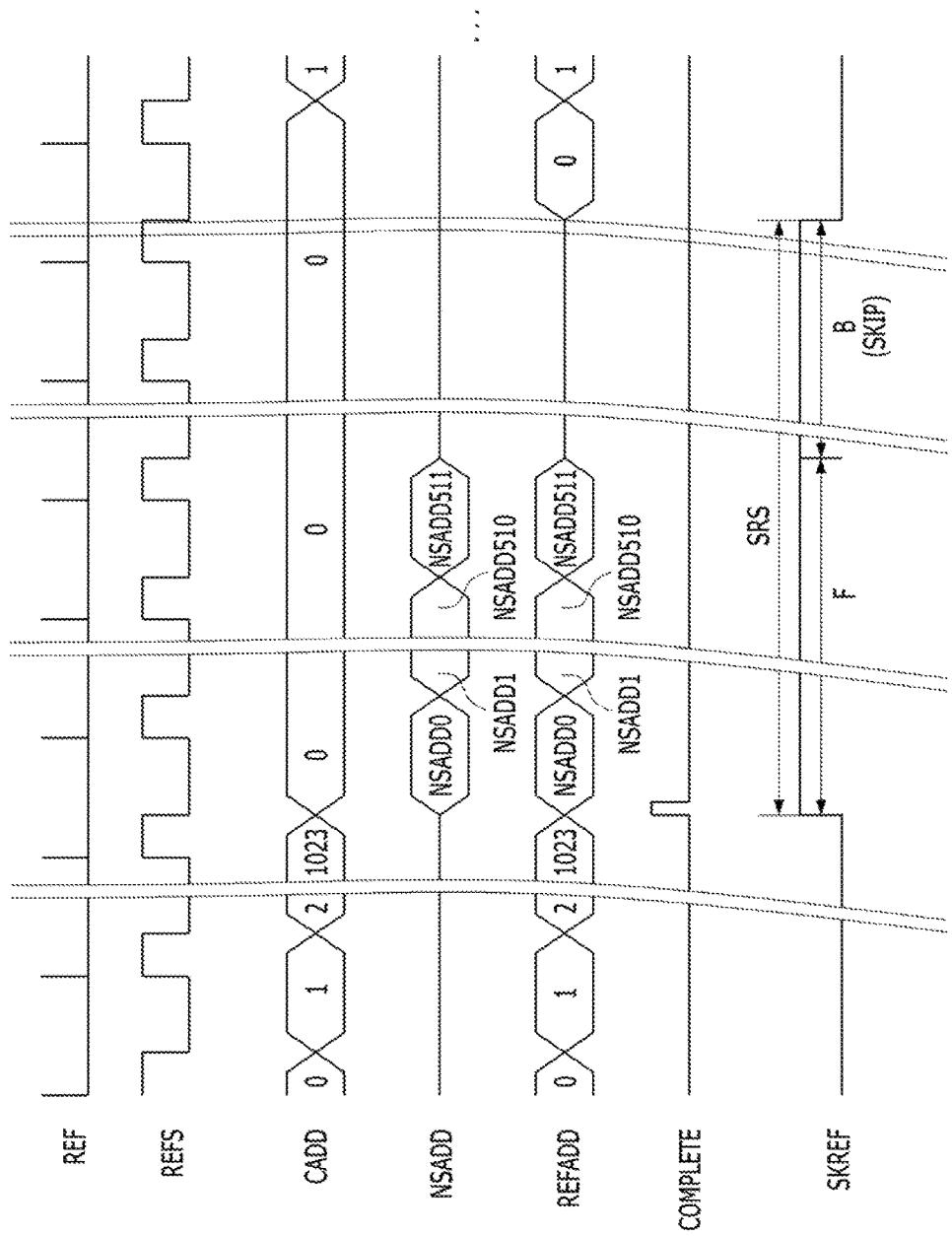

| 1 | — S0 | Output '1' stored in S0 when CADD = 0 |
| 1 | — S1 | Output '1' stored in S1 when CADD = 1 |
| 0 | — S2 | Output '0' stored in S2 when CADD = 2 |
| 1 | — S3 | Output '1' stored in S3 when CADD = 3 |
| 0 | — S4 | Output '0' stored in S4 when CADD = 4 |
| 1 | — S5 | Output '1' stored in S5 when CADD = 5 |

⋮

| 1 | — S1020 | Output '1' stored in S1020 when CADD = 1020 |
| 0 | — S1021 | Output '0' stored in S1021 when CADD = 1021 |
| 0 | — S1022 | Output '0' stored in S1022 when CADD = 1022 |
| 1 | — S1023 | Output '1' stored in S1023 when CADD = 1023 |

MEMORY DEVICE

CROSS-REFERENCE TO RELATED APPLICATION

This application claims priority under 35 U.S.C. § 119 to Korean Patent Application No. 10-2016-0134237 filed on Oct. 17, 2016 in the Korean Intellectual Property Office, the disclosure of which is incorporated herein by reference in its entirety.

TECHNICAL FIELD

Exemplary embodiments relate to a memory device and, more particularly, to a memory device for performing a refresh operation.

DISCUSSION OF THE RELATED ART

In general, a memory cell of a semiconductor memory device such as a dynamic random access memory (DRAM) includes and a capacitor for storing data in the form of electrical charges and one or more transistors serving as switches controlling the flow of charges to and from the capacitor. Data may be identified as a logic high level or a logic low level depending on whether or not charges are present in the capacitor of the memory cell, that is, whether a voltage across the terminals of the capacitor is high or low.

In principle, storage of data does not consume power because the data is stored in such a manner that charges are accumulated in a capacitor. However, data may be lost because an initial amount of charges stored in the capacitor may vanish due to leakage current attributable to a PN junction of a MOS transistor, or the like. In order to prevent such data loss, data in a memory cell may be read before the data is lost, and a normal amount of charges may be recharged based on the read Information. This operation is known as a refresh operation and is typically periodically repeated for retaining stored data.

Typically, a refresh operation is performed each time a refresh command is inputted from a memory controller to a memory. Moreover, the memory controller typically inputs the refresh command to the memory periodically at a predetermined time interval calculated based on a data retention time of a memory device. This means, that if, for example, the data retention time of a memory device is 64 ms and all the memory cells in the memory device may be refreshed when a refresh command is inputted 8000 times, the memory controller should input the refresh command to the memory 8000 times every 64 ms.

In a test process of a memory device, if the data retention times of some of the memory cells (hereinafter, referred to as "weak cells") included in the memory device do not meet a prescribed reference time, the corresponding memory device is handled as a fail and the memory device should be discarded.

When all the memory devices which Include weak cells are handled as falls, the yield may decrease substantially. Furthermore, although a memory device has passed a manufacturing test, an error may still occur because of weak cells which are induced due to posterior factors, i.e., factors arising after manufacturing of the memory device Moreover, as ultra-high integration requires at least several tens of millions of memory cells to be integrated in one chip, the probability of a weak cell to exist increases even through manufacturing processes have improved substantially. Hence, new techniques for determining and managing weak cells are needed for improving the reliability of semiconductor memory devices, and the yield of manufacturing processes, especially for ultra-high integrated semiconductor memory devices.

SUMMARY

Various embodiments are directed to a memory device for decreasing operation errors and reducing power consumption by additionally refreshing memory cells having a data retention time shorter than a first reference time while skipping the refresh of memory cells having a data retention time longer than a second reference time.

In an embodiment, a memory device may include: a plurality of memory cells; a weak address storage block suitable for storing a weak address of a weak cell of which data retention time is shorter than a reference time, among the plurality of memory cells; a refresh counter suitable for generating a counting address; and an address selection block suitable for outputting a refresh address by selecting one of the counting address and the weak address, wherein, in selecting the counting address, the address selection block selects the weak address for a predetermined period, when a value of at least one preset bit of the counting address is changed.

In an embodiment, a memory device may include: a plurality of memory cells; a weak address storage block suitable for storing a weak address of a weak cell of which data retention time is shorter than a reference time, among the plurality of memory cells; a refresh counter suitable for generating a counting address; and an address selection block suitable for outputting a refresh address by selecting one of the counting address and the weak address, wherein, in selecting the counting address, the address selection block selects the weak address for a predetermined period, when counting of the counting address is completed.

In an embodiment, a memory device may include: a plurality of memory cells; an address storage block suitable for storing a non-skip address of a memory cell excluding strong memory cells of which data retention time is longer than a reference time, among the plurality of memory cells; a refresh counter suitable for generating a counting address; and an address selection block suitable for outputting a refresh address by selecting one of the counting address and the non-skip address, wherein, in selecting the counting address, the address selection block selects the non-skip address for a predetermined period, when counting of the counting address is completed.

In an embodiment, a memory device may include: a plurality of memory cells; an information storage block suitable for storing a 1-bit information on whether a data retention time of one or more corresponding memory cells among the plurality of memory cells is longer than a reference time; a refresh counter suitable for generating a counting address; and an address selection block suitable for outputting a refresh address by selecting the counting address or blocking the counting address, wherein the address selection block selectively blocks the counting address depending on the 1-bit information, for a predetermined period, when counting of the counting address is completed.

BRIEF DESCRIPTION OF THE DRAWINGS

The above and other features and advantages of the present invention will become more apparent to those skilled in the art to which the present invention pertains by the following detailed description with reference to the attached drawings in which:

FIGS. 4A and 4B are a timing diagram explaining a refresh operation of the memory device shown in FIG. 3.

FIG. 8 is a diagram illustrating an Information storage block shown in FIG. 7.

DETAILED DESCRIPTION

Figure 1:
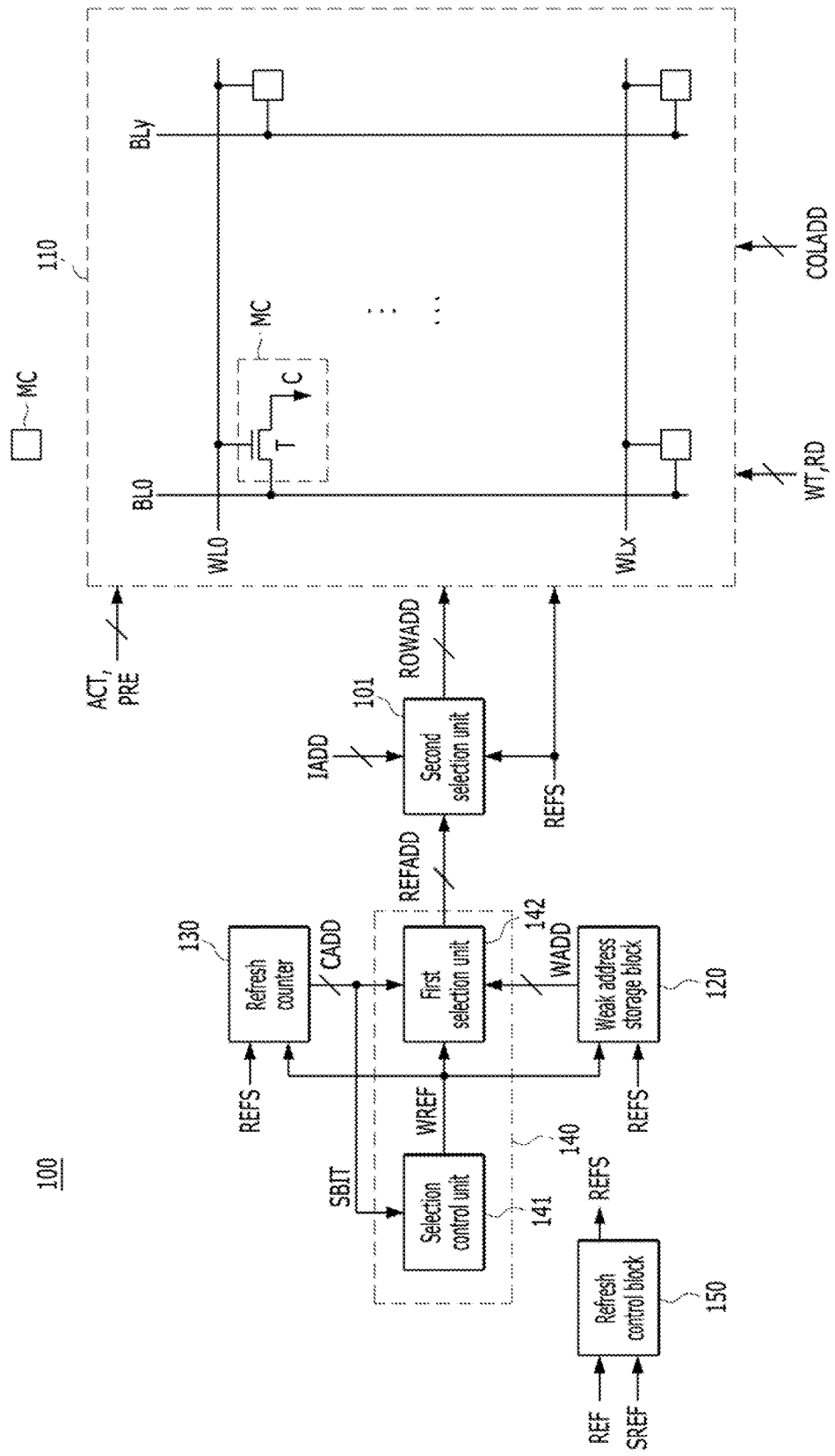
FIG. 1 is a block diagram Illustrating a memory device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram Illustrating a memory device 100 in accordance with an embodiment of the present invention.

Referring to FIG. 1, the memory device 100 may include a cell array and control circuit 110, a weak address storage block 120, a refresh counter 130, an address selection block 140, a refresh control block 150, and a second selection unit 101.

The cell array and control circuit 110 may include a plurality of word lines WL0 to WLx (x is a natural number), a plurality of bit lines BL0 to BLy (y is a natural number), and a plurality of memory cells MC which are coupled to corresponding word lines among the plurality of word lines WL0 to WLx and corresponding bit lines among the plurality of bit lines BL0 to BLy. While the detailed configuration of the control circuit is not Illustrated in FIG. 1, the control circuit may control an active operation and a precharge operation of a word line selected in response to a row address ROWADD among the word lines WL0 to WLx, and control a read operation on the data of a bit line selected in response to a column address COLADD among the bit lines BL0 to Bly or a write operation on data in a memory cell through the selected bit line.

In detail, the cell array and control circuit 110 may activate a word line corresponding to the row address ROWADD in response to an active command ACT, and precharge the activated word line in response to a precharge command PRE. Also, when a refresh signal REFS is activated, the cell array and control circuit 110 may activate a word line corresponding to the row address ROWADD, and precharge the word line after a predetermined time passes. Further, the cell array and control circuit 110 may output the data of bit lines corresponding to the column address COLADD to a device outside of the cell array and control circuit 110 in response to a read command RD, and drive bit lines corresponding to the column address COLADD with the data transferred from the outside of the cell array and control circuit 110 in response to a write command WT. Data may represent data to be inputted to the cell array and control circuit 110 or to be outputted from the cell array and control circuit 110. Each of the memory cells MC may include a cell transistor T and a cell capacitor C. The memory cell MC may store data by storing charges in the cell capacitor C. In FIG. 1, the internal configurations of the remaining memory cells MC excluding one memory cell MC are not illustrated.

The weak address storage block 120 may store the address of one or more weak cells, i.e., memory cells having data retention times shorter than a reference time, among the plurality of memory cells MC. The reference time may be changed depending on a setting. For example, the reference time may be 64 ms. However, the reference time may not be necessarily 64 ms, and, as the occasion demands, may be set to a time shorter than 64 ms (for example, 16 ms and 32 ms) or be set to a time longer than 64 ms (for example, 128 ms and 192 ms).

For determining whether the data retention time of memory cells MC is shorter than the reference time, or equal to or longer than the reference time, the following method may be used. First, test data of a predetermined pattern may be written in test target memory cells. Next, standby may be made for the reference time without refreshing the test target memory cells. After the reference time passes, the data of the test target memory cells may be read and be compared with the test data initially written in the test target memory cells. If the test data and the data read from the test target memory cells are the same, the data retention time of the test target memory cells may be equal to or longer than the reference time. If the test data and the data read from the test target memory cells are not the same, the data retention time of the test target memory cells may be shorter than the reference time. Accordingly, when the test data and the data read from the test target memory cells are not the same, the test target memory cells are determined to be weak cells.

Hereafter, descriptions will be made for the case where the weak address storage block 120 stores the address of a word line including weak cells among the plurality of word lines, as a weak address. That is, the weak address storage block 120 may store the row address of weak cells as a weak address. The weak address storage block 120 may store a plurality of weak addresses corresponding to a plurality of word lines having at least one weak memory cell.

The weak address storage block 120 may be deactivated and hence may not output the weak address stored therein, when a weak refresh signal WREF is deactivated. The weak address storage block 120 may output a weak address WADD when a refresh command REF is applied in a period in which the weak refresh signal WREF is activated. In other words, the weak address storage block 120 may not output the weak address WADD even when the refresh command REF is applied, in the case where the weak refresh signal WREF is deactivated, and may output the weak address WADD each time when the refresh command REF Is applied in the case where the weak refresh signal WREF is activated.

In detail, when the refresh signal REFS is activated and then deactivated when the weak refresh signal WREF Is activated, the weak address storage block 120 may sequentially output the weak address WADD stored therein, in response to a falling edge at which the refresh signal REFS is changed from an activated state to a deactivated state (hereinafter, referred to as a "deactivation edge").

The refresh counter 130 may perform counting in response to the refresh signal REFS, and generate a counting address CADD. In detail, the refresh counter 130 may perform counting in response to the deactivation edge of the refresh signal REFS. The refresh counter 130 may increase a value of the counting address CADD by 1 through counting. By increasing the value of the counting address CADD by 1, the plurality of word lines WL0 to WLx may be sequentially selected during a refresh operation.

The refresh counter 130 may reset the counting address CADD to an initial value in response to the deactivation edge of the refresh signal REFS when after the value of the counting address CADD reaches a maximum value. For example, in the case where the initial value of the counting address CADD is 0 (0000000000000 in binary number) and the maximum value of the counting address CADD is 8191 (1111111111111 in binary number), the refresh counter 130 may reset the counting address CADD to 0 in response to the deactivation edge of the refresh signal REFS in the state in which the value of the counting address CADD reaches 8191. Through this process, the refresh counter 130 may count repeatedly the counting address CADD from the initial value to the maximum value.

The refresh counter 130 may be deactivated and not perform counting, in a period in which the weak refresh signal WREF is activated. In detail, the refresh counter 130 may not count the value of the counting address CADD and retain it as it is, in the case where the weak refresh signal WREF is activated. Namely, the refresh counter 130 may perform counting in response to the deactivation edge of the refresh signal REFS in only a period in which the weak refresh signal WREF is deactivated.

The address selection block 140 may output a refresh address REFADD by selecting one of the counting address CADD and the weak address WADD outputted from the weak address storage block 120. The address selection block 140 may output the refresh address REFADD by selecting the counting address CADD, and then, if the value of at least one preset bit SBIT of the counting address CADD is changed, the address selection block 140 may output the refresh address REFADD by selecting the weak address WADD, for a predetermined period.

If the value of the preset bit SBIT is changed, the address selection block 140 may control the weak address storage block 120 to be activated and the refresh counter 130 to be deactivated, for the predetermined period. In the other period, the address selection block 140 may control the weak address storage block 120 to be deactivated and the refresh counter 130 to be activated. In detail, when the value of the preset bit SBIT is changed, the address selection block 140 may activate the weak refresh signal WREF for the predetermined period, and deactivate the weak refresh signal WREF in the other period.

For this operation, the address selection block 140 may include a selection control unit 141 and a first selection unit 142. The selection control unit 141 may receive the preset bit SBIT, and activate the weak refresh signal WREF for the predetermined period and then deactivate the weak refresh signal WREF, when the value of the preset bit SBIT is changed. The first selection unit 142 may output the refresh address REFADD by selecting one of the counting address CADD and the weak address WADD in response to the weak refresh signal WREF. The first selection unit 142 may output the refresh address REFADD by selecting the counting address CADD when the weak refresh signal WREF is deactivated, and output the refresh address REFADD by selecting the weak address WADD when the weak refresh signal WREF is activated.

The refresh control block 150 may perform a control task in response to the refresh command REF such that one or more memory cells corresponding to the refresh address REFADD among the plurality of memory cells MC are refreshed. In detail, the refresh control block 150 may activate the refresh signal REFS in response to the refresh command REF in an auto-refresh operation, and may cyclically activate the refresh signal REFS even though the refresh command REF is not applied, in a self-refresh operation. A self-refresh signal SREF may be a signal which is activated in a period in which the memory device 100 is set to perform the self-refresh operation. Accordingly, the refresh control block 150 may activate the refresh signal REFS in response to the refresh command REF in a period in which the self-refresh signal SREF is deactivated, and may cyclically activate the refresh signal REFS in a period in which the self-refresh signal SREF is activated.

The refresh signal REFS may be a signal which is activated in a period in which the memory device 100 performs the refresh operation (hereinafter, referred to as a "refresh operation period"). The refresh operation period may include a portion or all of a period from a time when the refresh command REF is applied to a time when a word line corresponding to the refresh address REFADD is activated and then precharged. The refresh operation period may be changed depending on a design, and may be a time needed to perform a refresh operation.

The second selection unit 101 may output the row address ROWADD by selecting one of an input address IADD and the refresh address REFADD in response to the refresh signal REFS. That is, the second selection unit 101 may output the row address ROWADD by selecting the input address IADD in a period in which the refresh signal REFS is deactivated, and may output the row address ROWADD by selecting the refresh address REFADD in a period in which the refresh signal REFS is activated.

Hereinbelow, descriptions will be made for an operation of the memory device 100 shown in FIG. 1, with reference to FIGS. 2A and 2B. Descriptions will be made for the case where the counting address CADD is composed of 10 bits, the number of the word lines WL0 to WLx is 1024, i.e., WL0 to WL1023, the values of the addresses of the respective word lines WL0 to WLx are 0 to 1023, the preset bit SBIT is the most significant bit (MSB) of the counting address CADD, and the weak address storage block 120 stores 10 weak addresses WADD0 to WADD9. The period in which the weak refresh signal WREF is activated, that is, a period in which refresh is performed for a weak address (hereinafter, referred to as a "weak refresh period"), may be set differently depending on a design.

In a first embodiment, the weak refresh period may be set to be ended when the refresh command REF is applied a predetermined number of times after the weak refresh signal WREF is activated. For example, the weak refresh period may be set to be ended when the refresh command REF is applied 5 times after the weak refresh signal WREF is activated. Alternatively, the weak refresh period may be set to be ended when the refresh command REF is applied 10 times after the weak refresh signal WREF is activated. The number of times by which the refresh command REF is applied to deactivate the weak refresh signal WREF (hereinafter, referred to as a "preset upper limit") may be changed depending on a design. The preset upper limit may be smaller than, or equal to or greater than the number of the weak addresses stored in the weak address storage block 120.

In the case where the preset upper limit is smaller than the number of the weak addresses stored in the weak address storage block 120, a weak refresh operation for the weak addresses stored in the weak address storage block 120 may be performed by being divided into at least two weak refresh periods. This operation will be described later in reference to FIG. 2A. In the case where the preset upper limit is equal to or greater than the number of the weak addresses stored in the weak address storage block 120, a weak refresh operation for the weak addresses stored in the weak address storage block 120 may be completed in a single weak refresh period. This operation will be described later in reference to FIG. 2B.

In a second embodiment, the weak refresh period may be set to be ended when a predetermined time passes from a time when the weak refresh signal WREF is activated. For example, the weak refresh period may be set to be ended when several to several tens of thousands of micro seconds (μs) pass after the weak refresh signal WREF is activated. The weak refresh period may be set to a different time depending on a design, and the number of weak addresses to be refreshed for one weak refresh period may be smaller than, or equal to or greater than the number of the weak addresses stored in the weak address storage block 120.

In the case where the weak refresh period allows a number of weak addresses to be refreshed which is smaller than the number of the weak addresses stored in the weak address storage block 120, a weak refresh operation for the weak addresses stored in the weak address storage block 120 may be performed by being divided into at least two consecutive weak refresh periods. In the case where the weak refresh period allows a number of weak addresses to be refreshed which is equal to or greater than the number of the weak addresses stored in the weak address storage block 120, then a weak refresh operation for all of the weak addresses stored in the weak address storage block 120 may be completed in a single weak refresh period.

All of the activation and deactivation operations of the weak refresh signal WREF through the above-described first and second embodiments may be performed by the selection control unit 141. In accordance with the first embodiment, the selection control unit 141 may include a counter which performs counting by counting the number of times by which the refresh command REF is applied, for example, by counting the number of the deactivation edges of the refresh signal REFS occurring after the weak refresh signal WREF is activated. The selection control unit 141 may deactivate the weak refresh signal WREF when the number of times by which the refresh command REF is applied reaches the preset upper limit after the weak refresh signal WREF is activated.

In accordance with the second embodiment, the selection control unit 141 may include a timer which measures a time from when the weak refresh signal WREF is activated. The selection control unit 141 may deactivate the weak refresh signal WREF when a predetermined time set in the timer passes after the weak refresh signal WREF is activated.

Figure 2A:
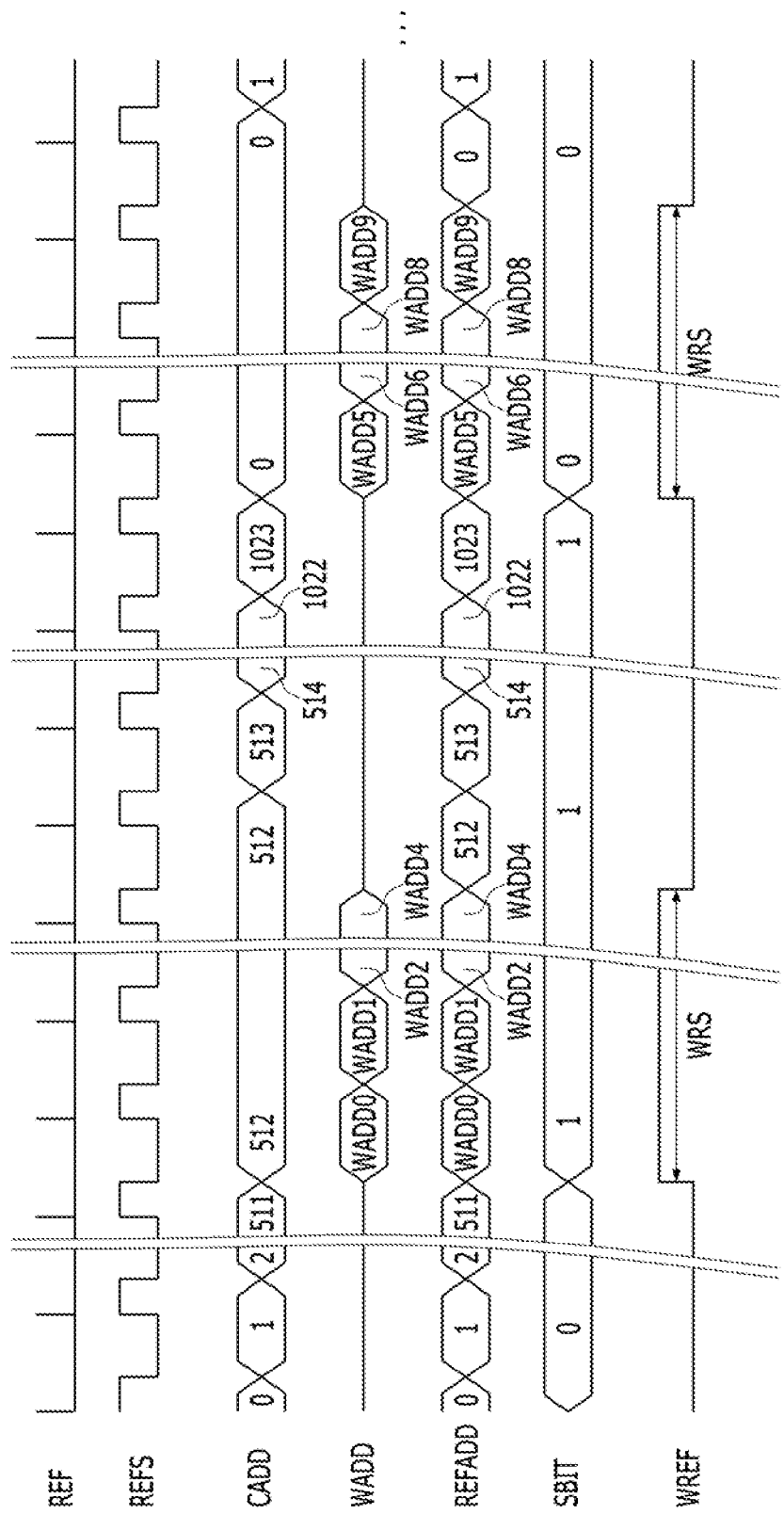
FIGS. 2A and 2B are a timing diagram explaining a refresh operation of the memory device shown in FIG. 1.

FIG. 2A is a timing diagram explaining a refresh operation of the memory device 100 shown in FIG. 1.

Referring to FIG. 2A, descriptions will be made for the refresh operation of the memory device 100 in the case where the number of weak addresses stored in the weak address storage block 120 is 10, and 5 weak addresses are refreshed in a single weak refresh period WRS. The refresh signal REFS may be activated once each time the refresh command REF is applied.

If the refresh signal REFS is activated when the refresh command REF is applied in a state in which the weak refresh signal WREF is deactivated, then a word line corresponding to the counting address CADD may be refreshed. Since the counting address CADD starts from 0, word lines may be refreshed sequentially one by one starting from the word line WL0 every time the refresh signal REFS is activated as the refresh command REF is applied. Since the preset bit SBIT is the most significant bit of the counting address CADD, the preset bit SBIT may be '0.' In a period in which the weak refresh signal WREF is deactivated, the counting address CADD may be selected and outputted as the refresh address REFADD.

If the counting address CADD is changed from 511 (0111111111 in binary number) to 512 (1000000000 in binary number), the value of the preset bit SBIT may be changed from '0' to '1.' If the logic value of the preset bit SBIT is changed, the weak refresh signal WREF may be activated. If the weak refresh signal WREF is activated, a weak address WADD0 may be outputted from the weak address storage block 120. In a period in which the weak refresh signal WREF remains activated, the value of the counting address CADD is retained as 512, and the weak address WADD may be sequentially changed in response to the deactivation edge (for example, falling edge) of the refresh signal REFS. Further, the weak address WADD may be selected by the first selection unit 142 and outputted as the refresh address REFADD. A word line corresponding to the weak address WADD may thus be refreshed in response to the refresh signal REFS. In this way, in the weak refresh period WRS in which the refresh signal REFS is activated 5 times after the weak refresh signal WREF is activated, word lines corresponding to weak addresses WADD0 to WADD4 which are sequentially outputted from the weak address storage block 120 (and, not to the counting addresses CADD) may be refreshed.

If the weak refresh period WRS is ended and the weak refresh signal WREF is deactivated, a word line corresponding to the counting address CADD may be refreshed again. If the counting address CADD is changed from 1023 (1111111111 In binary number) to 0 (0000000000 in binary number), the value of the preset bit SBIT may be changed from '1' to '0.' If the logic value of the preset bit SBIT is changed, the weak refresh signal WREF may be activated. During the weak refresh period WRS after the weak refresh signal WREF is activated, word lines corresponding to 5 weak addresses WADD5 to WADD9 may be refreshed. Thereafter, the above-described operations may be repeated.

For reference, it is to be noted that FIG. 2A illustrates a mere example and that the number of preset bits SBIT, the number of weak addresses, the length of one weak refresh period WRS, and so forth may be changed depending on a design. For example, in the case where the number of preset bits SBIT is 2 most significant bits (MSBs), the number of weak addresses stored in the weak address storage block 120 is 64, and one weak refresh period WRS corresponds to a time for which the refresh command REF is applied 16 times, a refresh operation may be performed as in Table 1.

TABLE 1

| The number of refresh command REF | Value of counting address CADD | Value of preset bit SBIT | Weak address WADD | Kind of refresh operation |
|---|---|---|---|---|
| 0-255 | 0-255 | 00 | — | NR |
| 256-271 | 256 | 01 | WADD0-WADD15 | WR |
| 272-527 | 256-511 | 01 | — | NR |
| 528-543 | 512 | 10 | WADD16-WADD31 | WR |
| 544-799 | 512-767 | 10 | — | NR |
| 800-815 | 768 | 11 | WADD32-WADD47 | WR |
| 816-1071 | 768-1023 | 11 | — | NR |
| 1072-1087 | 0 | 00 | WADD48-WADD63 | WR |

In Table 1, "the number of refresh command REF" may represent the number of times by which the refresh command REF is applied, "weak address WADD" may represent the weak address WADD outputted from the weak address storage block 120, and "kind of refresh operation" may represent whether a refresh operation is a normal refresh operation "NR" for refreshing a word line corresponding to the counting address CADD or a weak refresh operation "WR" for refreshing a word line corresponding to the weak address WADD.

Figure 2B:
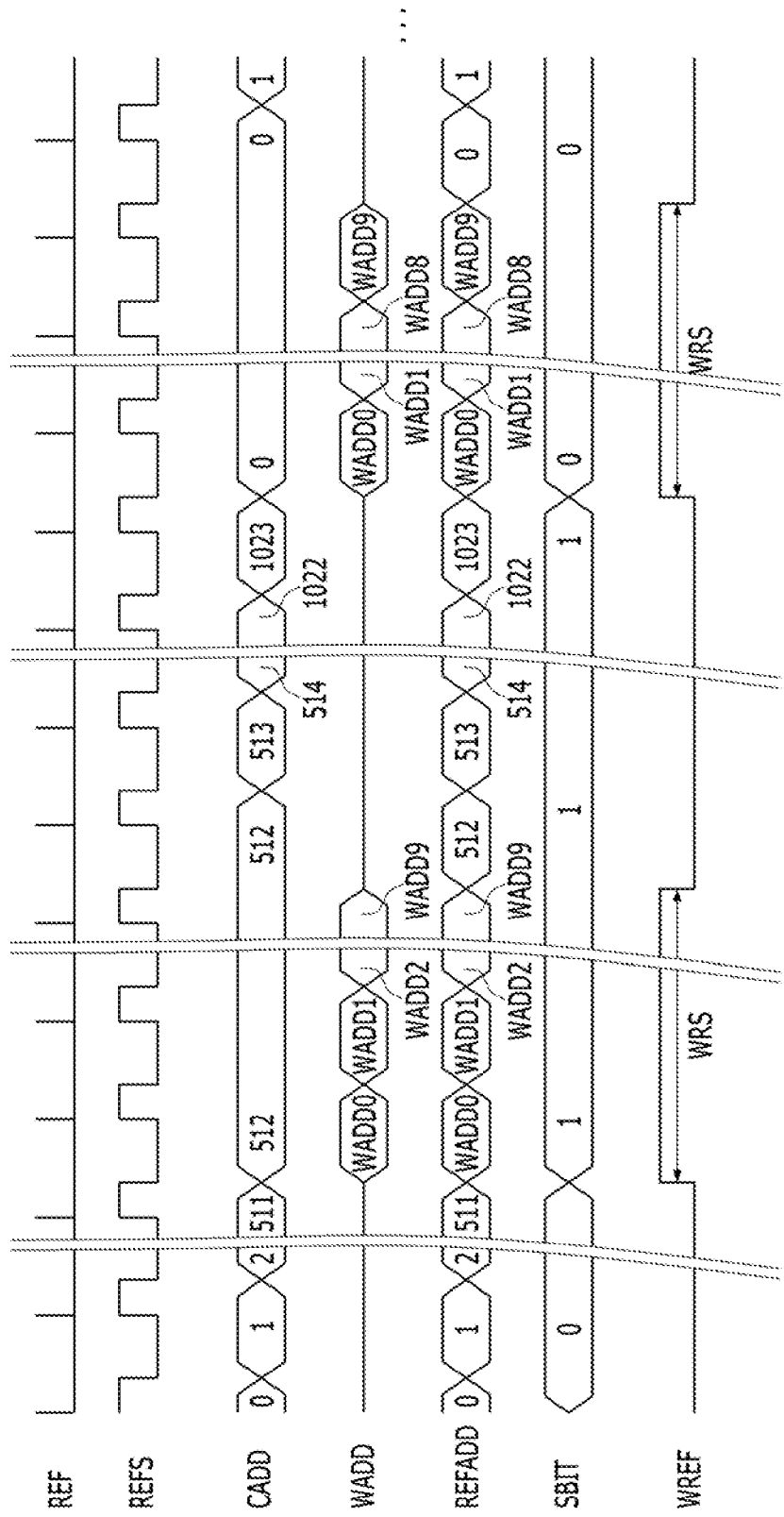

FIG. 2B is a timing diagram explaining a refresh operation of the memory device 100 shown in FIG. 1.

Referring to FIG. 2B, descriptions will be made for the refresh operation of the memory device 100 in the case where the number of weak addresses stored in the weak address storage block 120 is 10, and 10 weak addresses are refreshed in a single weak refresh period WRS. The refresh signal REFS may be activated once each time the refresh command REF is applied.

The refresh operation of FIG. 2B is similar to the refresh operation of FIG. 2A except that the weak refresh period WRS of FIG. 2 is longer than the weak refresh period WRS of FIG. 1. Because a weak refresh operation may be performed for all of the weak addresses WADD0 to WADD9 which are stored in the weak address storage block 120 in a single weak refresh period WRS, word lines corresponding to the weak addresses WADD0 to WADD9 may be refreshed one time after the preset bit SBIT is changed from '0' to '1' and may be refreshed another one time after the preset bit SBIT is changed from '1' to '0.'

For reference, it is to be noted that FIG. 2B illustrates a mere example and that the number of preset bits SBIT, the number of weak addresses, the length of one weak refresh period WRS, and so forth may be changed depending on a design. For example, in the case where the number of preset bits SBIT is 2 most significant bits (MSBs), the number of weak addresses stored in the weak address storage block 120 is 8, and one weak refresh period WRS corresponds to a time for which the refresh command REF is applied 16 times, a refresh operation may be performed as in Table 2.

TABLE 2

| The number of refresh command REF | Value of counting address CADD | Value of preset bit SBIT | Weak address WADD | Kind of refresh operation |
|---|---|---|---|---|
| 0-255 | 0-255 | 00 | — | NR |
| 256-271 | 256 | 01 | WADD0-WADD7 (2 time repetition) | WR |
| 272-527 | 256-511 | 01 | — | NR |
| 528-543 | 512 | 10 | WADD0-WADD7 (2 time repetition) | WR |
| 544-799 | 512-767 | 10 | — | NR |
| 800-815 | 768 | 11 | WADD0-WADD7 (2 time repetition) | WR |
| 816-1071 | 768-1023 | 11 | — | NR |
| 1072-1087 | 0 | 00 | WADD0-WADD7 (2 time repetition) | WR |

Figure 3:
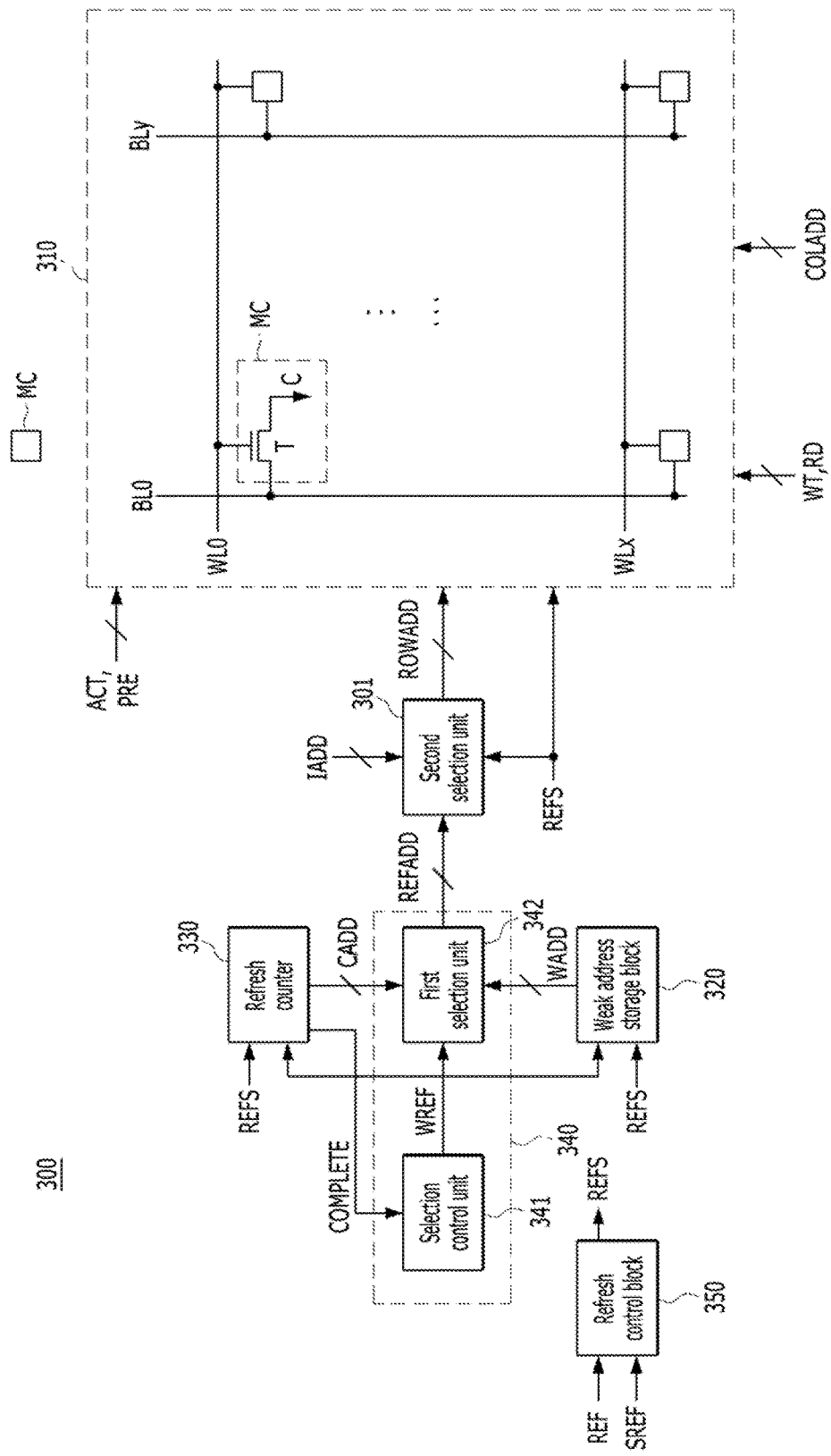
FIG. 3 is a block diagram illustrating a memory device in accordance with an embodiment of the present invention.

FIG. 3 is a block diagram illustrating a memory device 300 in accordance with an embodiment of the present invention.

Referring to FIG. 3, the memory device 300 may include a cell array and control circuit 310, a weak address storage block 320, a refresh counter 330, an address selection block 340, a refresh control block 350, and a second selection unit 301. Descriptions for components of which detailed configurations and operations are the same as the components described above with reference to FIG. 1, among the components shown in FIG. 3, will be omitted herein.

The refresh counter 330 may activate a completion signal COMPLETE when counting of a counting address CADD Is completed. In detail, the refresh counter 330 may activate the completion signal COMPLETE when a value of the counting address CADD reaches a maximum value.

The address selection block 340 may output a refresh address REFADD by selecting one of the counting address CADD and a weak address WADD outputted from the weak address storage block 320. The address selection block 340 may output the refresh address REFADD by selecting the counting address CADD, and then, if the counting of the counting address CADD is completed, the address selection block 340 may output the refresh address REFADD by selecting the weak address WADD, for a predetermined period. If the completion signal COMPLETE is activated, the address selection block 340 may control the weak address storage block 320 to be activated and the refresh counter 330 to be deactivated, for the predetermined period. In the other period, i.e., the period remaining within two consecutive activations of the completion signal COMPLETE, other than the predetermined period the address selection block 340 may control the weak address storage block 320 to be deactivated and the refresh counter 330 to be activated. Hence, the predetermined period is a period during which a weak refresh is performed and is, hereinafter, referred to as a weak refresh period, whereas the remaining period is a period during which a normal refresh operation is performed and is referred to as a normal refresh period.

In detail, when the completion signal COMPLETE is activated, the address selection block 340 may activate a weak refresh signal WREF for the predetermined period (i.e., the weak refresh period), and deactivate the weak refresh signal WREF in the other period, i.e., the normal refresh period.

For this operation, the address selection block 340 may include a selection control unit 341 and a first selection unit 342. The selection control unit 341 may receive the completion signal COMPLETE, and activate the weak refresh signal WREF for the predetermined period when the completion signal COMPLETE is activated. When the predetermined period expires, the selection control unit 341 may then deactivate the weak refresh signal WREF for the period remaining until a new activated complete signal is received by the selection control unit 341. The first selection unit 342 may output the refresh address REFADD by selecting one of the counting address CADD and the weak address WADD in response to the weak refresh signal WREF. Specifically, the first selection unit 342 may output the refresh address REFADD by selecting the counting address CADD when the weak refresh signal WREF is deactivated, and output the refresh address REFADD by selecting the weak address WADD when the weak refresh signal WREF is activated.

The weak address storage block 320 may output at least once all of the weak address WADD stored therein, for the predetermined period. Hence, a refreshing operation of all of the weak word lines may be performed one or more times during a single weak refresh period WRS depending on design.

FIG. 4A is a timing diagram explaining a refresh operation of the memory device 300 shown in FIG. 3.

Referring to FIG. 4A, descriptions will be made for the refresh operation of the memory device 300 in the case where the number of weak addresses stored in the weak address storage block 320 is 128, and one weak refresh period WRS corresponds to a time that is sufficient for refreshing 128 word lines. A refresh signal REFS may be activated once each time a refresh command REF is applied.

If the refresh signal REFS is activated when the weak refresh signal WREF is deactivated, a word line corresponding to the counting address CADD may be refreshed. The refresh counter 330 may activate the completion signal COMPLETE each time when counting is completed. If the completion signal COMPLETE is activated, the weak refresh signal WREF may be activated. When the weak refresh signal WREF is activated, the refresh operation may be performed in a manner similar to the refresh operation of FIG. 2A, and thus, word lines corresponding to weak addresses WADD0 to WADD127, not the counting addresses CADD, may be refreshed in the weak refresh period WRS. If the weak refresh period WRS is ended after the refresh command REF is applied 128 times, the weak refresh signal WREF may be deactivated. Thereafter, the above-described operations may be repeated.

For reference, it is to be noted that FIG. 4A illustrates a mere example and that the number of weak addresses, the length of one weak refresh period WRS, and so forth may be changed depending on a design. For example, in the case where the number of weak addresses stored in the weak address storage block 320 is 128, one weak refresh period WRS corresponds to a time for which the refresh command REF is applied 256 times and respective word lines corresponding to weak addresses are refreshed 2 times in a single weak refresh period WRS, a refresh operation may be performed as in Table 3.

TABLE 3

| The number of refresh command REF | Value of counting address CADD | Weak address WADD | Kind of refresh operation |
| --- | --- | --- | --- |
| 0-1023 | 0-1023 | — | NR |
| 1024-1279 | 0 | WADD0-WADD127 (2 time repetition) | WR |
| 1280-2303 | 0-1023 | — | NR |
| 2304-2559 | 0 | WADD0-WADD127 (2 time repetition) | WR |

FIG. 4B is a timing diagram explaining a refresh operation of the memory device 300 shown in FIG. 3.

Referring to FIG. 4B, descriptions will be made for the refresh operation of the memory device 300 in the case where the number of weak addresses stored in the weak address storage block 320 is 128, and one weak refresh period WRS corresponds to a time that is sufficient for refreshing 256 word lines. A refresh signal REFS may be activated once each time a refresh command REF is applied. In the weak refresh period WRS, word lines corresponding to respective weak addresses may be refreshed one time during a front part F, and refresh may be skipped during a back part B.

If the refresh signal REFS is activated when the weak refresh signal WREF is deactivated, a word line corresponding to the counting address CADD may be refreshed. The refresh counter 330 may activate the completion signal COMPLETE each time when counting is completed. If the completion signal COMPLETE is activated, the weak refresh signal WREF may be activated.

In FIG. 4B, since the number of the weak addresses stored in the weak address storage block 320 is 128 and the weak refresh period WRS corresponds to a period in which the refresh command REF is applied 256 times, the weak refresh period WRS is longer than a time needed for all the weak addresses to be refreshed. While Table 3 shows the case where weak word lines are refreshed 2 times in a single weak refresh period WRS, FIG. 4B shows the case where all weak word lines are refreshed one time during the front part F of the weak refresh period WRS and then the refresh operation is skipped during the back part B of the weak refresh period WRS.

For reference, it is to be noted that FIG. 4B illustrates a mere example and that the number of weak addresses, the length of one weak refresh period WRS, and so forth may be changed depending on a design. For example, in the case where the number of weak addresses stored in the weak address storage block 320 is 128, one weak refresh period WRS corresponds to a time for which the refresh command REF is applied 512 times, and word lines corresponding to the weak addresses are refreshed two time with a time interval in one weak refresh period WRS, a refresh operation may be performed as in Table 4.

TABLE 4

| The number of refresh command REF | Value of counting address CADD | Weak address WADD | Kind of refresh operation |
| --- | --- | --- | --- |
| 0-1023 | 0-1023 | — | NR |
| 1024-1151 | 0 | WADD0-WADD127 | WR |
| 1152-1279 | 0 | — | SKIP |
| 1280-1407 | 0 | WADD0-WADD127 | WR |
| 1408-1535 | 0 | — | SKIP |
| 1536-2559 | 0-1023 | — | NR |
| 2560-2687 | 0 | WADD0-WADD127 | WR |
| 2688-2815 | 0 | — | SKIP |
| 2816-2943 | 0 | WADD0-WADDI27 | WR |
| 2944-3071 | 0 | — | SKIP |

In Table 4, "SKIP" may represent a period in which refresh is not performed and is skipped.

Figure 5:
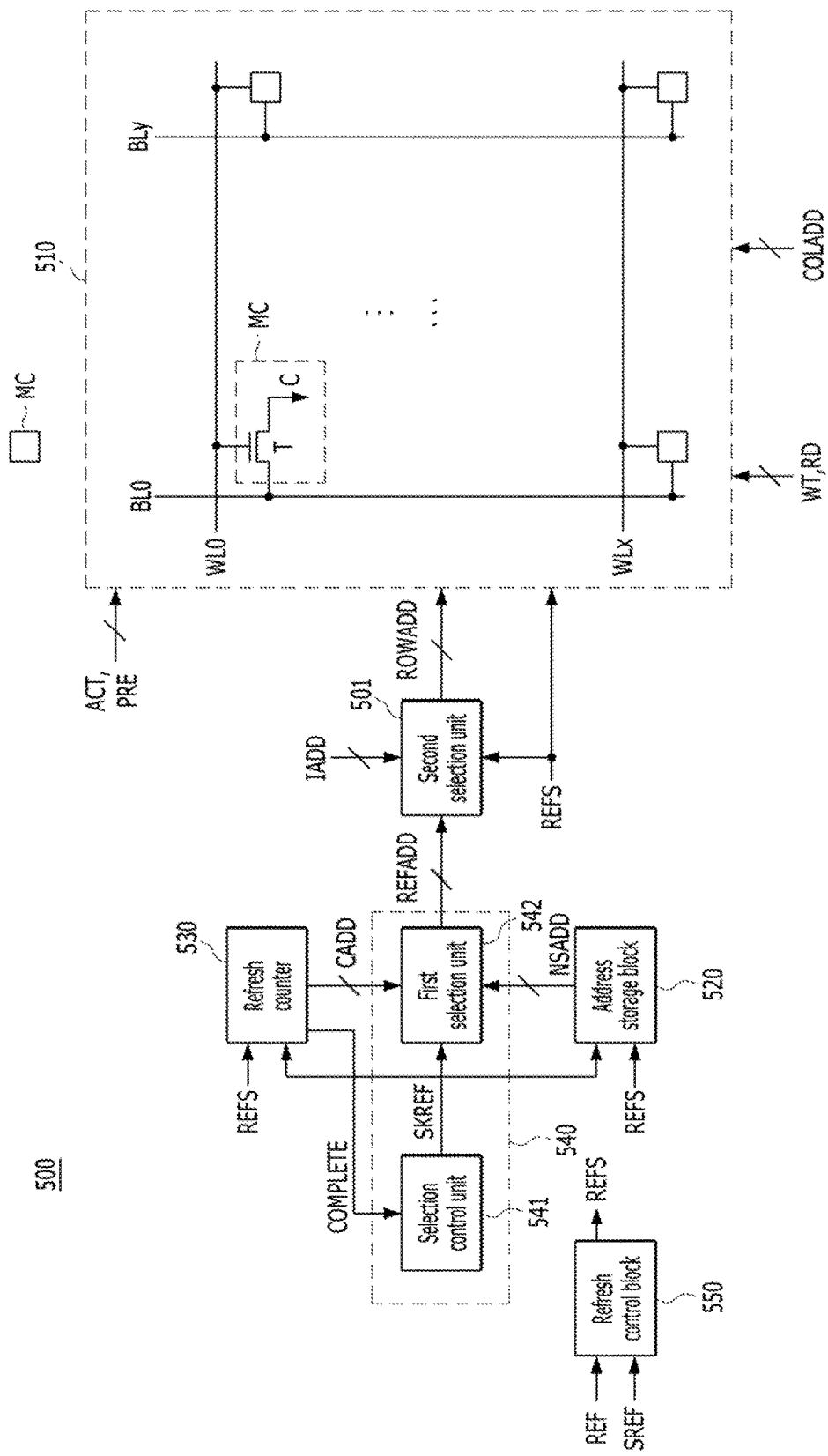
FIG. 5 is a block diagram illustrating a memory device in accordance with an embodiment of the present invention.

FIG. 5 is a block diagram Illustrating a memory device 500 in accordance with an embodiment of the present invention.

Referring to FIG. 5, the memory device 500 may include a cell array and control circuit 510, an address storage block 520, a refresh counter 530, an address selection block 540, a refresh control block 550, and a second selection unit 501. Descriptions for components of which detailed configurations and operations are the same as the components described above with reference to FIGS. 1 and 3, among the components shown in FIG. 5, will be omitted herein.

The address storage block 520 may store a non-skip address NSADD that is an address of memory cells excluding strong cells of which data retention time is longer than a reference time, among a plurality of memory cells MC. The reference time may be changed depending on a setting. For example, the reference time may be 64 ms. However, the reference time may not be necessarily 64 ms, and, as the occasion demands, may be set to a time shorter than 64 ms (for example, 16 ms and 32 ms) or be set to a time longer than 64 ms (for example, 128 ms and 192 ms). In general, the reference time for determining strong cells may be set to at least 2 times the data retention time requested in the specification of a memory device such as the JEDEC specification.

The address storage block 520 may be deactivated and not output the non-skip address NSADD stored therein, in the case where a skip refresh signal SKREF is deactivated. The address storage block 520 may output the non-skip address NSADD when a refresh command REF is applied in a period in which the skip refresh signal SKREF is activated (hereinafter, referred to as a "skip refresh period"). In other words, the address storage block 520 may not output the non-skip address NSADD even when the refresh command REF is applied, in the case where the skip refresh signal SKREF is deactivated, and may output the non-skip address NSADD each time when the refresh command REF is applied in the case where the skip refresh signal SKREF is activated.

In detail, when a refresh signal REFS is activated and then deactivated when the skip refresh signal SKREF is activated, the address storage block 520 may sequentially output the non-skip address NSADD stored therein, in response to a deactivation edge at which the refresh signal REFS is changed from an activated state to a deactivated state.

The refresh counter 530 may activate a completion signal COMPLETE when counting of a counting address CADD is completed. The refresh counter 530 may activate the completion signal COMPLETE when a value of the counting address CADD reaches a maximum value.

The address selection block 540 may output a refresh address REFADD by selecting one of the counting address CADD and the non-skip address NSADD outputted from the weak address storage block 520. The address selection block 540 may output the refresh address REFADD by selecting the counting address CADD, and then, if the counting of the counting address CADD is completed, the address selection block 540 may output the refresh address REFADD by selecting the non-skip address NSADD, for a predetermined period. If the completion signal COMPLETE is activated, the address selection block 540 may control the address storage block 520 to be activated and the refresh counter 530 to be deactivated, for the predetermined period. In the other period, the address selection block 540 may control the address storage block 520 to be deactivated and the refresh counter 530 to be activated. In detail, when the completion signal COMPLETE is activated, the address selection block 540 may activate the skip refresh signal SKREF for the predetermined period, and deactivate the skip refresh signal SKREF in the other period.

For this operation, the address selection block 540 may include a selection control unit 541 and a first selection unit 542. The selection control unit 541 may receive the completion signal COMPLETE, activate the skip refresh signal SKREF for the predetermined period, and then deactivate the skip refresh signal SKREF, when the completion signal COMPLETE is activated. The first selection unit 542 may output the refresh address REFADD by selecting one of the counting address CADD and the non-skip address NSADD in response to the skip refresh signal SKREF. The first selection unit 542 may output the refresh address REFADD by selecting the counting address CADD in the case where the skip refresh signal SKREF is deactivated, and output the refresh address REFADD by selecting the non-skip address NSADD outputted from the address storage block 520 in the case where the skip refresh signal SKREF is activated.

The address storage block 520 may output at least one time the plurality of non-skip addresses NSADD stored therein, for the predetermined period.

FIG. 6A is a timing diagram explaining a refresh operation of the memory device 500 shown in FIG. 5.

Referring to FIG. 6A, descriptions will be made for the refresh operation of the memory device 500 in the case where the number of the row addresses of strong cells, i.e., the addresses of word lines to which strong cells are coupled, (hereafter, referred to as "strong addresses") is 512. That is, the number of non-skip addresses NSADD stored in the address storage block 520 is 512, and one skip refresh period SRS corresponds to a time that is sufficient for refreshing 1024 word lines. The refresh signal REFS may be activated once each time the refresh command REF is applied.

The address storage block 520 stores the 512 non-skip addresses NSADD0 to NSADD511, and the skip refresh period SRS corresponds to a period in which the refresh signal REFS is activates 1024 times. That is, the skip refresh period SRS is longer than a time needed to refresh word lines corresponding to all the non-skip addresses NSADD0 to NSADD511 (hereinafter, referred to as "non-skip word lines"). In one skip refresh period SRS, the refresh operation for the 512 non-skip addresses NSADD0 to NSADD511 (hereinafter, referred to as a "non-skip refresh operation") is completed during a front part F, and the refresh operation may be skipped during a back part B.

The refresh signal REFS is activated when the refresh command REF is applied when the skip refresh signal SKREF is deactivated. At this time, a word line corresponding to the counting address CADD may be refreshed. The refresh counter 530 may activate the completion signal COMPLETE each time when counting is completed. If the completion signal COMPLETE is activated, the skip refresh signal SKREF may be activated. When the skip refresh signal SKREF Is activated, the non-skip addresses NSADD0 to NSADD511 may be sequentially outputted from the address storage block 520 in response to the deactivation edge of the refresh signal REFS. When the skip refresh signal SKREF is activated, the value of the counting address CADD may be retained as 0.

In this way, in the skip refresh period SRS, during the front part F in which the refresh command REF is applied 512 times after the skip refresh signal SKREF is activated, the non-skip word lines may be refreshed. After the non-skip refresh operation is completed, the refresh operation may be skipped while the refresh command REF is applied 512 times, during the back part B in the skip refresh period SRS. Thereafter, the above-described operations may be repeated.

For reference, it is to be noted that FIG. 6A illustrates a mere example and that the number of non-skip addresses, the length of one skip refresh period SRS, and so forth may be changed depending on a design. For example, in the case where the number of non-skip addresses is 512, one skip refresh period SRS corresponds to a time for which the refresh command REF is applied 2048 times, and the non-skip word lines are refreshed one time and are refreshed again after a preselected time passes and refresh is not performed in the other period of the skip refresh period SRS, a refresh operation may be performed as in Table 5. In Table 5, "NSR" may represent a non-skip refresh operation.

TABLE 5

| The number of refresh command REF | Value of counting address CADD | Weak address WADD | Kind of refresh operation |
|---|---|---|---|
| 0-1023 | 0-1023 | — | NR |
| 1024-1535 | 0 | NSADD0-NSADD511 | NSR |
| 1536-2047 | 0 | — | SKIP |
| 2048-2559 | 0 | NSADD0-NSADD511 | NSR |
| 2560-3071 | 0 | — | SKIP |
| 3072-4095 | 0-1023 | — | NR |
| 4096-4607 | 0 | NSADD0-NSADD511 | NSR |
| 4608-5119 | 0 | — | SKIP |
| 5120-5631 | 0 | NSADD0-NSADD511 | NSR |
| 5632-6143 | 0 | — | SKIP |

Figure 6B:
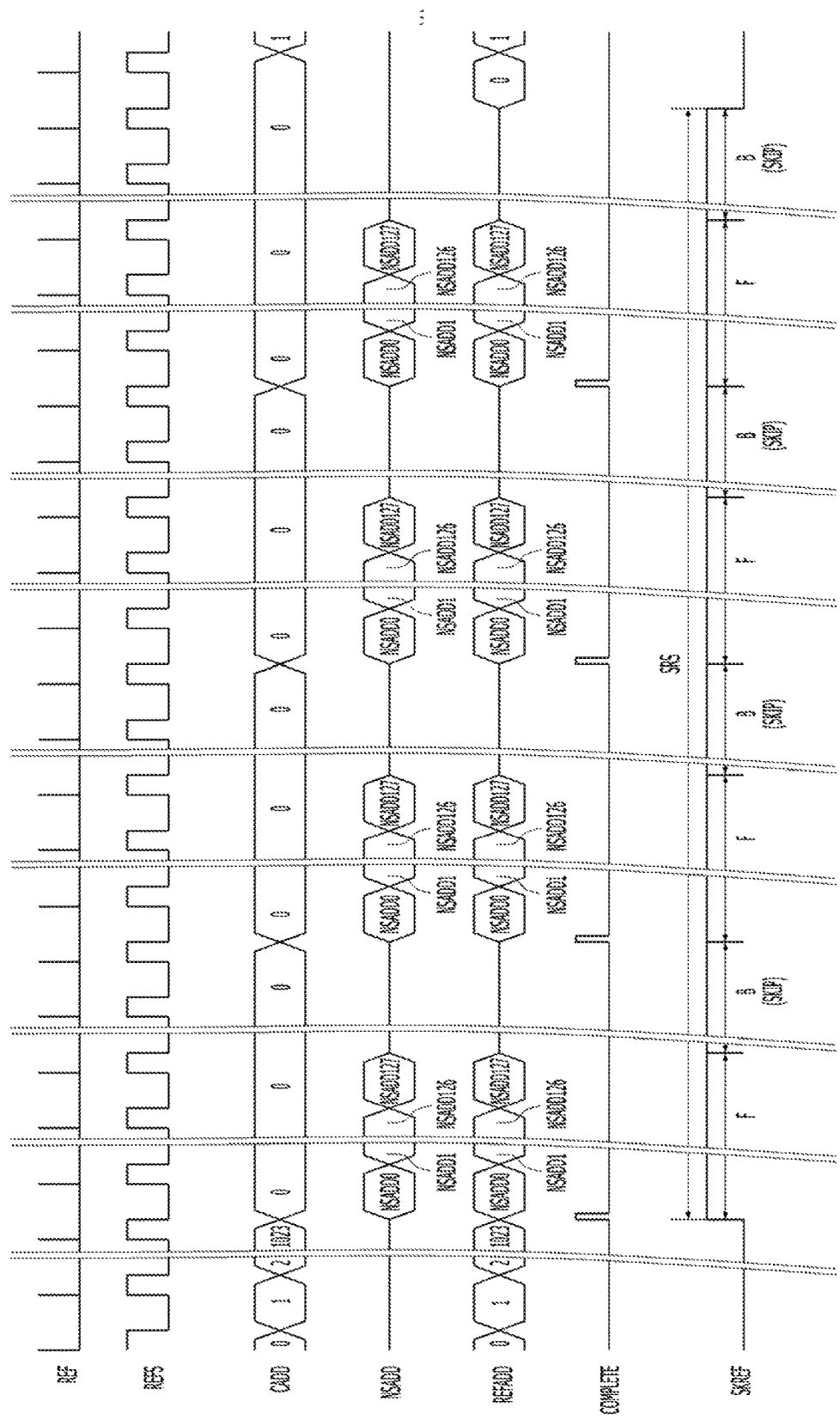
FIG. 6A are 6B are a timing diagram explaining a refresh operation of the memory device shown in FIG. 5.

FIG. 6B is a timing diagram explaining a refresh operation of the memory device 500 shown in FIG. 5.

Referring to FIG. 6B, descriptions will be made for the refresh operation of the memory device 500 in the case where the number of the strong addresses is 896, that is, the number of non-skip addresses NSADD stored in the address storage block 520 is 128, and one skip refresh period SRS corresponds to a time that is sufficient for refreshing 1024 word lines. The refresh signal REFS may be activated once each time the refresh command REF is applied.

The address storage block 520 stores the 128 non-skip addresses NSADD0 to NSADD127, and the skip refresh period SRS corresponds to a period in which the refresh signal REFS is activates 1024 times. In one skip refresh period SRS, the non-skip refresh operation for the 128 non-skip addresses NSADD0 to NSADD127 is performed repeatedly, e.g., 4 times, and the refresh operation may be skipped for preselected periods after each non-skip refresh operation for the 128 non-skip addresses NSADD0 to NSADD127 is completed.

After the skip refresh signal SKREF is activated, the non-skip refresh operation is performed while the refresh command REF is applied 128 times during a front part F, and the refresh operation may be skipped while the refresh command REF is applied next 128 times during a back part B. This operation may be repeated 4 times in one skip refresh period SRS. Thereafter, the above-described operations may be repeated. The refresh operation of FIG. 6B may be performed as in Table 6.

TABLE 6

| The number of refresh command REF | Value of counting address CADD | Weak address WADD | Kind of refresh operation |
|---|---|---|---|
| 0-1023 | 0-1023 | — | NR |
| 1024-1151 | 0 | NSADD0-NSADD127 | NSR |
| 1152-1279 | 0 | — | SKIP |
| 1280-1407 | 0 | NSADD0-NSADD127 | NSR |
| 1408-1535 | 0 | — | SKIP |
| 1536-1663 | 0 | NSADD0-NSADD127 | NSR |
| 1664-1791 | 0 | — | SKIP |
| 1792-1919 | 0 | NSADD0-NSADD127 | NSR |
| 1920-2047 | 0 | — | SKIP |

Figure 7:
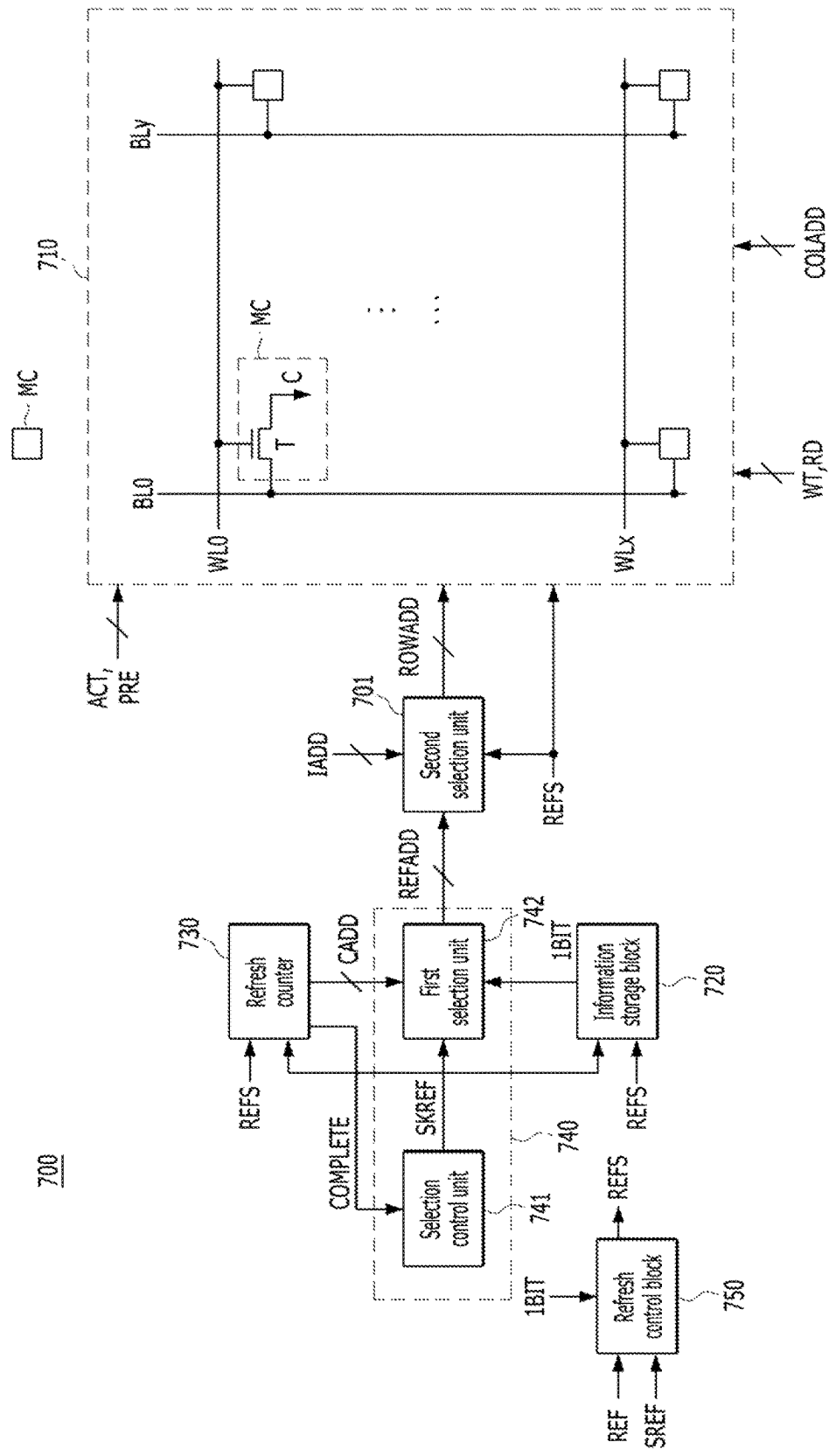
FIG. 7 is a block diagram illustrating a memory device in accordance with an embodiment of the present invention.

FIG. 7 is a block diagram illustrating a memory device 700 in accordance with an embodiment of the present invention.

Referring to FIG. 7, the memory device 700 may include a cell array and control circuit 710, an information storage block 720, a refresh counter 730, an address selection block 740, a refresh control block 750, and a second selection unit 701. Descriptions for components of which detailed configurations and operations are the same as the components described above with reference to FIGS. 1, 3 and 5, among the components shown in FIG. 7, will be omitted herein.

The information storage block 720 may store a 1-bit information 1BIT on whether a data retention time of one or more memory cells among a plurality of memory cells MC is longer than a reference time. For example, the information storage block 720 may store the 1-bit information 1BIT corresponding to each of word lines WL0 to WLx. The 1-bit Information 1BIT may have the value of '1' in the case where the data retention time of a corresponding word line is equal to or shorter than the reference time, and may have the value of '0' in the case where the data retention time of a corresponding word line is longer than the reference time. In other words, an address of a word line corresponding to the 1-bit information 1BIT of '1' may correspond to a non-skip address as described above with reference to FIG. 5, and an address of a word line corresponding to the 1-bit information 1BIT of '0' may correspond to a strong address as described above with reference to FIG. 5.

The information storage block 720 may be deactivated and not output the 1-bit information 1BIT stored therein, in the case where a skip refresh signal SKREF is deactivated. The information storage block 720 may output one by one the 1-bit informations 1BIT stored therein, every time a refresh command REF is applied, in a skip refresh period in which the skip refresh signal SKREF is activated. Namely, the information storage block 720 may not output the 1-bit information 1BIT even through the refresh command REF is applied, in the case where the skip refresh signal SKREF is deactivated, and may output the 1-bit Information 1BIT each time when the refresh command REF is applied in the case where the skip refresh signal SKREF is activated.

In detail, when a refresh signal REFS is activated and then deactivated when the skip refresh signal SKREF is activated, the information storage block 720 may sequentially output the 1-bit information 1BIT, in response to a deactivation edge of the refresh signal REFS. For reference, the information storage block 720 may output at least one time the plurality of 1-bit informations 1BIT stored therein, for a predetermined period.

The refresh counter 730 may activate a completion signal COMPLETE when counting of a counting address CADD is completed. The refresh counter 730 may activate the completion signal COMPLETE when a value of the counting address CADD reaches a maximum value. However, the refresh counter 730 may not activate the completion signal COMPLETE but perform continuously a counting operation even though the value of the counting address CADD reaches a maximum value, in the case where the skip refresh signal SKREF is in an activated state. Unlike the refresh counters of FIGS. 1, 3 and 5, the refresh counter 730 of FIG. 7 may not be deactivated and may perform continuously a counting operation, regardless of the activation or deactivation of the skip refresh signal SKREF.

The address selection block 740 may output a refresh address REFADD by selecting the counting address CADD or blocking the counting address CADD. The address selection block 740 may output the refresh address REFADD by selecting the counting address CADD, and then, if counting of the counting address CADD is completed, the address selection block 740 may output the refresh address REFADD by selectively blocking the counting address CADD depending on the 1-bit information 1BIT outputted from the information storage block 720, for the predetermined period.

If the completion signal COMPLETE is activated, the address selection block 740 may control the information storage block 720 to be activated for the predetermined period. In the other period, the address selection block 740 may control the information storage block 720 to be deactivated. In detail, the address selection block 740 may activate the skip refresh signal SKREF for the predetermined period if the completion signal COMPLETE is activated, and deactivate the skip refresh signal SKREF in the other period.

For this operation, the address selection block 740 may include a selection control unit 741 and a first selection unit 742. The selection control unit 741 may receive the completion signal COMPLETE, activate the skip refresh signal SKREF for the predetermined period, and then deactivate the skip refresh signal SKREF, when the completion signal COMPLETE is activated. The first selection unit 742 may output the refresh address REFADD by selecting the counting address CADD in the case where the skip refresh signal SKREF is deactivated, and output the refresh address REFADD by selectively blocking the counting address CADD based on the 1-bit information 1BIT in the case when the skip refresh signal SKREF is activated. For example, the first selection unit 742 may output the refresh address REFADD by selecting the counting address CADD when the 1-bit information 1BIT has a first logic value (for example, '1'), and block the counting address CADD when the 1-bit Information 1BIT has a second logic value (for example, '0'), in the case where the skip refresh signal SKREF is activated.

FIG. 8 is a diagram illustrating the Information storage block 720 shown in FIG. 7.

Referring to FIG. 8, the information storage block 720 may include storage units S0 to S1023 which have the same number as the number of word lines (for example, 1024) to store the same number of 1-bit informations 1BIT.

In each of the storage units S0 to S1023, '1' or '0' may be stored depending on the data retention time of each of corresponding word lines WL0 to WL1023. The values stored in the storage units S0 to S1023 may be outputted sequentially in the skip refresh period. For example, in the case where counting addresses CADD corresponding to the word lines WL0 to WL1023 are outputted sequentially from the refresh counter 730, the 1-bit informations 1BIT stored in the storage units S0 to S1023 may be outputted sequentially. Namely, the value stored in the storage unit S0 may be outputted when the value of the counting address CADD is "0" corresponding to the word line WL0, the value stored in the storage unit S1 may be outputted when the value of the counting address CADD is "1" corresponding to the word line WL1, and the value stored in the storage unit S2 may be outputted when the value of the counting address CADD is "2" corresponding to the word line WL2. As values are outputted in this way, the value stored in the storage unit S1023 may be outputted when the value of the counting address CADD is "1023" corresponding to the word line WL1023.

Figure 9:
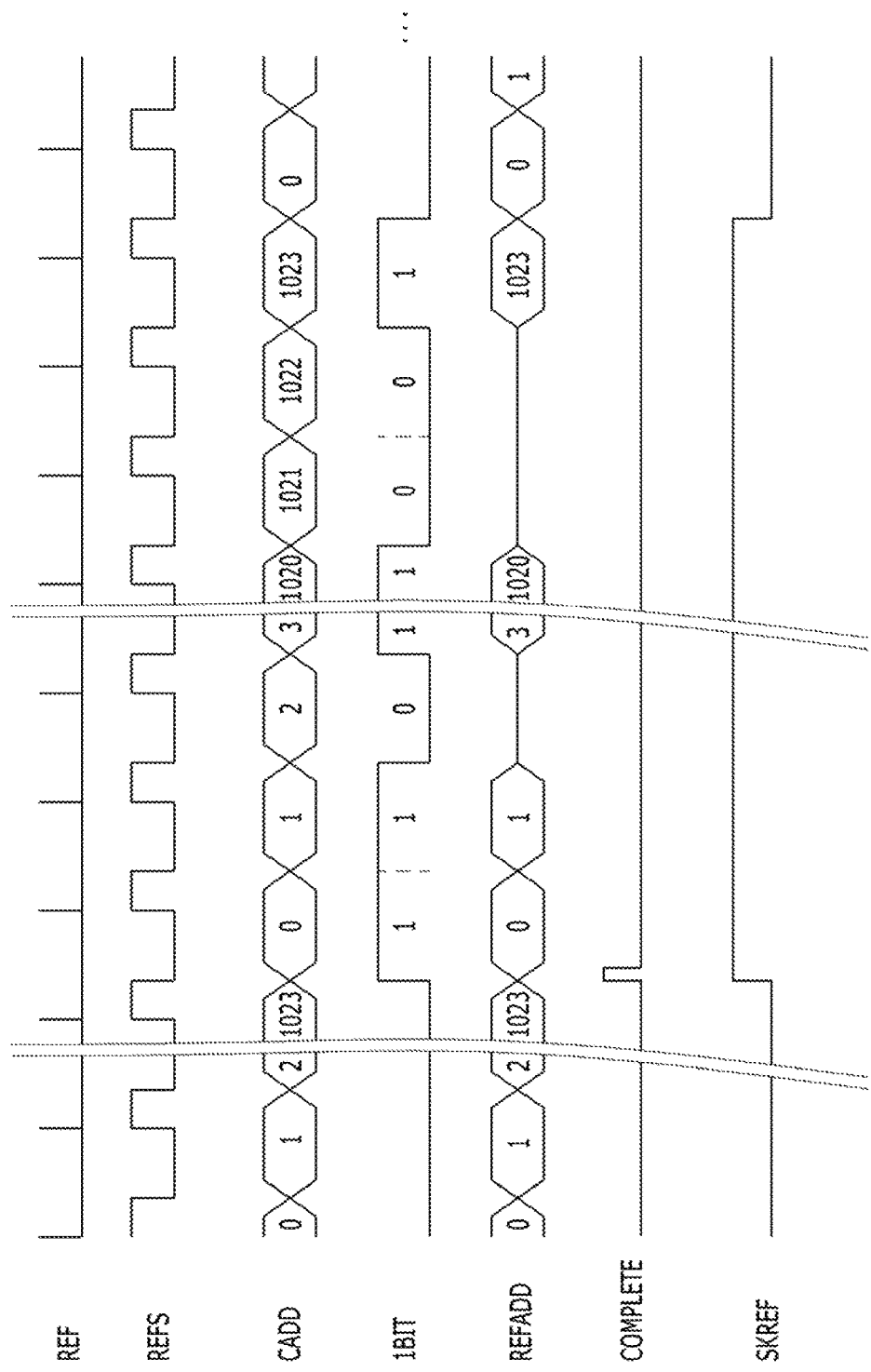
FIG. 9 is a timing diagram explaining a refresh operation of the memory device shown in FIG. 7.

FIG. 9 is a timing diagram explaining a refresh operation of the memory device 700 shown in FIG. 7.

Referring to FIG. 9, descriptions will be made for the refresh operation of the memory device 700 in the case where one weak refresh period corresponds to a time that is sufficient for refreshing 1024 word lines. The refresh signal REFS may be activated once each time the refresh command REF is applied.

If the refresh signal REFS is activated when the skip refresh signal SKREF is deactivated, a word line corresponding to the counting address CADD may be refreshed. The refresh counter 730 may activate the completion signal COMPLETE when counting is completed. If the completion signal COMPLETE is activated, the skip refresh signal SKREF may be activated. If the skip refresh signal SKREF is activated, a first 1-bit information 1BIT may be outputted from the Information storage block 720. Referring to FIG. 8, the value of the first 1-bit information 1BIT may be "1". Accordingly, the counting address CADD may be selected and outputted as the refresh address REFADD. The 1-bit information 1BIT may be sequentially outputted in response to the deactivation edge of the refresh signal REFS. In the case where the value of the 1-bit information 1BIT is "0", the counting address CADD may not be selected and may be blocked. In this way, when the refresh command REF is applied 1024 times after the skip refresh signal SKREF is activated, the skip refresh signal SKREF may be deactivated and the skip refresh period may be ended. Thereafter, the above-described operations may be repeated.

Figure 10:
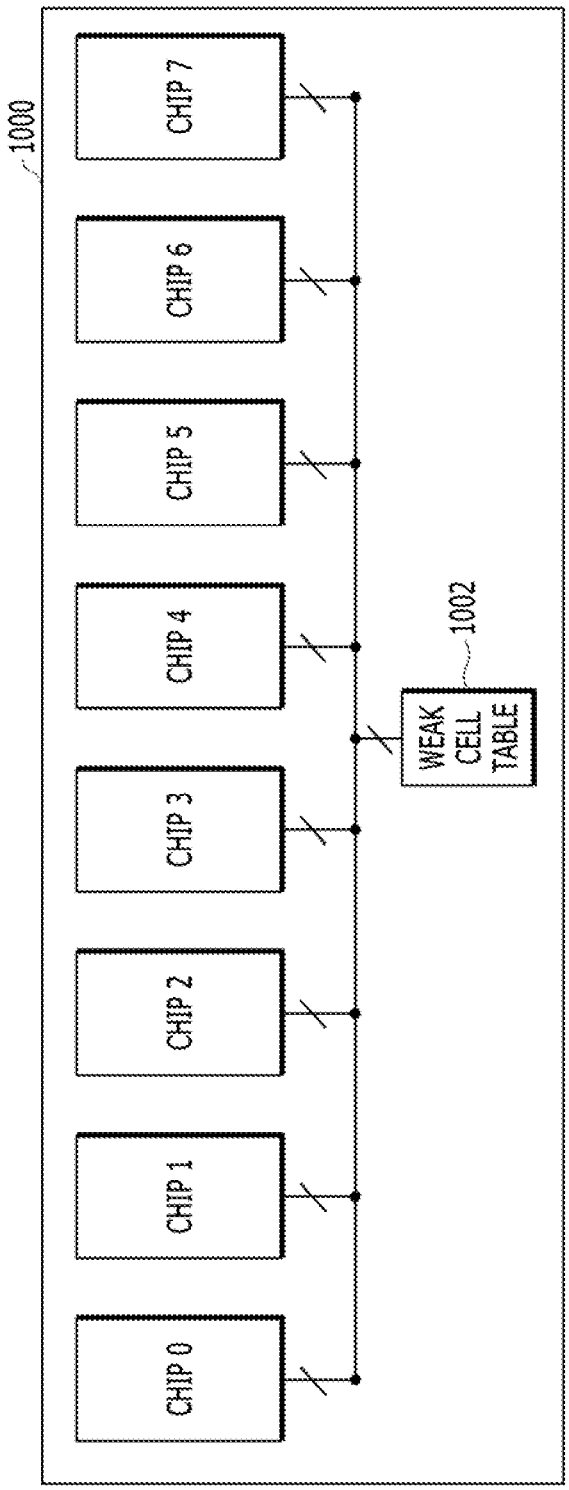
FIG. 10 is a block diagram illustrating a memory module in accordance with an embodiment of the present invention.

FIG. 10 is a block diagram a memory module 1000 in accordance with an embodiment of the present invention.

Referring to FIG. 10, the memory module 1000 may include a plurality of memory chips CHIP0 to CHIP7, and a weak cell table 1002. The weak cell table 1002 may be positioned outside the plurality of memory chips CHIP0 to CHIP7. The memory module 1000 may correspond to the memory devices 100, 300, or 500 illustrated in FIG. 1, 3, or 5, and the weak cell table 1002 may correspond to the weak address storage block 120 of FIG. 1, the weak address storage block 320 of FIG. 3 or the address storage block 520 of FIG. 5. While it is illustrated in FIG. 10 that the memory device includes one weak cell table 1002, the number of weak cell table 1002 may be changed depending on a design.

The weak cell table 1002 may be one of nonvolatile memory circuits such as a fuse circuit, a read only memory (ROM), a NOR flash memory, a NAND flash memory, a phase change random access memory (PRAM), a resistive random access memory (RRAM), a spin transfer torque random access memory (STTRAM) and a magnetic random access memory (MRAM), and various circuits which perform functions similar to the nonvolatile memory circuits to store data.

Figure 11:
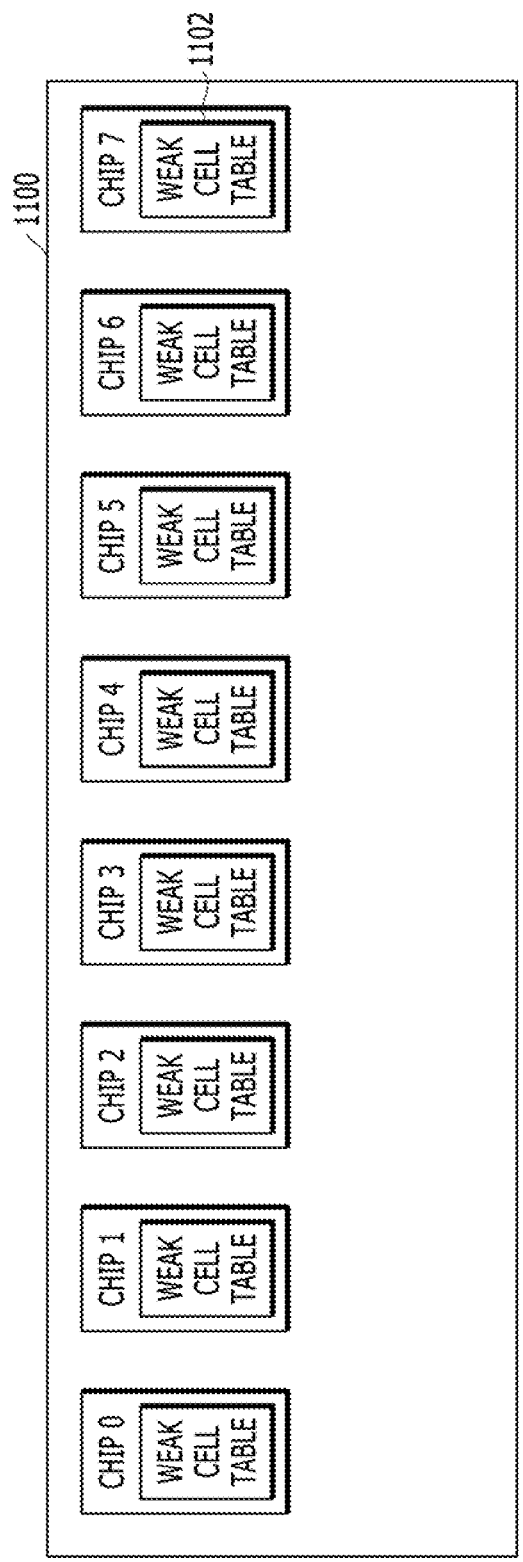
FIG. 11 is a block diagram illustrating a memory module in accordance with an embodiment of the present invention.

FIG. 11 is a block diagram Illustrating a memory module 1100 in accordance with an embodiment of the present invention.

Referring to FIG. 11, the memory module 1100 may include a plurality of memory chips CHIP0 to CHIP7, and a plurality of weak cell tables 1102. Each of the weak cell tables 1102 may be positioned inside a corresponding one of the plurality of memory chips CHIP0 to CHIP7. The memory module 1100 may correspond to the memory devices 100, 300, or 500 illustrated in FIG. 1, 3, or 5, and each weak cell table 1102 may correspond to the weak address storage block 120 of FIG. 1, the weak address storage block 320 of FIG. 3 or the address storage block 520 of FIG. 5. While it is illustrated in FIG. 11 that each of the memory chips CHIP0 to CHIP7 includes one weak cell table 1102, the number of weak cell tables 1102 may be changed depending on a design.

The weak cell table 1102 may be one of nonvolatile memory circuits such as a fuse circuit, a read only memory (ROM), a NOR flash memory, a NAND flash memory, a phase change random access memory (PRAM), a resistive random access memory (RRAM), a spin transfer torque random access memory (STTRAM) and a magnetic random access memory (MRAM), and various circuits which perform functions similar to the nonvolatile memory circuits to store data.

In the memory devices described above with reference to FIGS. 1 to 11, by refreshing weak cells with a high frequency or refreshing strong cells with a low frequency, it is possible to manage the weak cells to prevent the data of the weak cells from being lost and minimize power to be consumed due to refresh. Also, by refreshing the address of weak cells without comparison with a counting address in a predetermined period in the case where a predetermined condition is satisfied, the area of a circuit for weak cell management may be reduced and complexity may be decreased.

In the present technology, by additionally refreshing memory cells having a data retention time shorter than a first reference time and skipping the refresh of memory cells having a data retention time longer than a second reference time, it is possible to prevent the data of the memory cells from being degraded and reduce power to be consumed for refresh.

Although various embodiments have been described for illustrative purposes, it will be apparent to those skilled in the art that various changes and modifications may be made without departing from the spirit and scope of the invention as defined in the following claims.

What is claimed is:

1. A memory device comprising:
   a plurality of memory cells;
   a weak address storage block suitable for storing a weak address of a weak cell of which data retention time is shorter than a reference time, among the plurality of memory cells;
   a refresh counter suitable for generating a counting address; and
   an address selection block suitable for outputting a refresh address by selecting one of the counting address and the weak address, wherein the address selection block deactivates the refresh counter and selects the weak address as the refresh address for a predetermined period, when a value of at least one preset bit of the counting address is changed.

2. The memory device according to claim 1, wherein the address selection block controls the weak address storage block to be activated and the refresh counter to be deactivated, for the predetermined period.

3. The memory device according to claim 1, wherein the weak address storage block outputs the weak address when a refresh command is applied, for the predetermined period.

4. The memory device according to claim 1, wherein the address selection block comprises:
   a selection control unit suitable for activating a weak refresh signal for the predetermined period, when the value of the preset bit is changed; and
   a selection unit suitable for outputting the refresh address by selecting the counting address in the case where the weak refresh signal is deactivated, and outputting the refresh address by selecting the weak address in the case where the weak refresh signal is activated.

5. The memory device according to claim 1,
   wherein the memory device is a memory module which includes a plurality of memory chips, and
   wherein the weak address storage block is positioned outside the plurality of memory chips.

6. The memory device according to claim 1,
   wherein the memory device is a memory module which includes a plurality of memory chips, and
   wherein the weak address storage block is positioned inside each of the plurality of memory chips.

7. A memory device comprising:
   a plurality of memory cells;
   a weak address storage block suitable for storing a weak address of a weak cell of which data retention time is shorter than a reference time, among the plurality of memory cells;
   a refresh counter suitable for generating a counting address; and
   an address selection block suitable for outputting a refresh address by selecting one of the counting address and the weak address, wherein the address selection block selects the weak address for a predetermined period, when counting of the counting address is completed,
   wherein the address selection block comprises:
      a selection control unit suitable for activating a weak refresh signal for the predetermined period, when the counting of the counting address is completed; and
      a selection unit suitable for outputting the refresh address by selecting the counting address in the case where the weak refresh signal is deactivated, and outputting the refresh address by selecting the weak address in the case where the weak refresh signal is activated.

8. The memory device according to claim 7, wherein the address selection block controls the weak address storage block to be activated and the refresh counter to be deactivated, for the predetermined period.

9. The memory device according to claim 7, wherein the weak address storage block outputs repeatedly the weak address one or more times for the predetermined period.

10. The memory device according to claim 7, wherein the weak address storage block outputs the weak address when a refresh command is applied, for the predetermined period.

11. The memory device according to claim 7,
    wherein the memory device is a memory module which includes a plurality of memory chips, and
    wherein the weak address storage block is positioned outside the plurality of memory chips.

12. The memory device according to claim 7,
    wherein the memory device is a memory module which includes a plurality of memory chips, and
    wherein the weak address storage block is positioned inside each of the plurality of memory chips.

13. A memory device comprising:
    a plurality of memory cells;
    an address storage block suitable for storing a non-skip address of a memory cell excluding strong memory cells of which data retention time is longer than a reference time, among the plurality of memory cells;
    a refresh counter suitable for generating a counting address; and
    an address selection block suitable for outputting a refresh address by selecting one of the counting address and the non-skip address, wherein the address selection block selects the non-skip address for a predetermined period, when counting of the counting address is completed, wherein the address selection block comprises:
- a selection control unit suitable for activating a skip refresh signal for the predetermined period, when the counting of the counting address is completed; and
- a selection unit suitable for outputting the refresh address by selecting the counting address in the case where the skip refresh signal is deactivated, and outputting the refresh address by selecting the non-skip address in the case where the skip refresh signal is activated.

14. The memory device according to claim 13, wherein the address selection block controls the address storage block to be activated and the refresh counter to be deactivated, for the predetermined period.

15. A memory device comprising:
- a plurality of memory cells;
- an information storage block suitable for storing a 1-bit information on whether a data retention time of one or more corresponding memory cells among the plurality of memory cells is longer than a reference time;
- a refresh counter suitable for generating a counting address; and
- an address selection block suitable for outputting a refresh address by selecting the counting address or blocking the counting address, wherein the address selection block blocks the counting address corresponding to a first logic value of the 1-bit information, for a predetermined period, when counting of the counting address is completed.

16. The memory device according to claim 15, wherein the address selection block controls the information storage block to be activated, for the predetermined period.

17. The memory device according to claim 15, wherein the address selection block comprises:
- a selection control unit suitable for activating a skip refresh signal for the predetermined period, when the counting of the counting address is completed; and
- a selection unit suitable for outputting the refresh address by selecting the counting address in the case where the skip refresh signal is deactivated, and selectively blocking the counting address based on the 1-bit information in the case where the skip refresh signal is activated.

18. The memory device according to claim 17, wherein the selection unit selects the counting address as the refresh address when the 1-bit information has a second logic value, and blocks the counting address when the 1-bit information has the first logic value, in the case where the skip refresh signal is activated.

* * * * *